US011005287B1

(12) United States Patent
Partee et al.

(10) Patent No.: US 11,005,287 B1
(45) Date of Patent: May 11, 2021

(54) ADVANCED MOBILE ENERGY STORAGE DEVICE

(71) Applicant: PTGHS, LLC, Fraser, CO (US)

(72) Inventors: Charles Partee, Golden, CO (US); Kevin Magenis, Loveland, CO (US); Brian Magenis, Loveland, CO (US); John Vicars, Loveland, CO (US); Mike Nakamura, Portland, OR (US)

(73) Assignee: PTGHS, LLC, Fraser, CO (US)

( * ) Notice: Subject to any disclaimer, the term of this patent is extended or adjusted under 35 U.S.C. 154(b) by 0 days.

(21) Appl. No.: 16/799,831

(22) Filed: Feb. 25, 2020

Related U.S. Application Data

(62) Division of application No. 15/668,866, filed on Aug. 4, 2017, now Pat. No. 10,608,453.

(51) Int. Cl.
| | |
|---|---|
| *G08B 21/00* | (2006.01) |
| *H02J 7/34* | (2006.01) |
| *H01M 10/42* | (2006.01) |
| *H02J 3/32* | (2006.01) |
| *H02J 7/00* | (2006.01) |
| *G01R 31/36* | (2020.01) |
| *H02J 7/02* | (2016.01) |

(52) U.S. Cl.
CPC .............. *H02J 7/342* (2020.01); *G01R 31/36* (2013.01); *H01M 10/4207* (2013.01); *H02J 3/32* (2013.01); *H02J 7/0014* (2013.01); *H02J 7/02* (2013.01)

(58) Field of Classification Search
CPC ................................. H02J 7/342; H02J 7/0054
USPC ............ 340/636.1, 636.2; 136/245, 251, 291
See application file for complete search history.

(56) References Cited

U.S. PATENT DOCUMENTS

| | | | |
|---|---|---|---|
| 4,939,912 | A | 7/1990 | Leonovich, Jr. |
| 5,153,561 | A | 10/1992 | Johnson |
| 5,979,175 | A | 11/1999 | Ellison |
| 6,305,185 | B1 | 10/2001 | Sloan |
| 7,481,070 | B2 | 1/2009 | Costanzo |
| 7,722,204 | B1 | 5/2010 | Sandberg |

(Continued)

OTHER PUBLICATIONS

Jonathan Fincher, Solar Cooler Keeps Drinks Cold Using the Sun Instead of Ice, Jan. 23, 2014, New Atlas—New Technology & Science News, https://newatlas.com/solar-cooler/30567/.

(Continued)

*Primary Examiner* — Tai T Nguyen
(74) *Attorney, Agent, or Firm* — Pritzkau Patent Group LLC

(57) ABSTRACT

An advanced mobile energy storage device includes an energy storage component for the storage of electrical energy and characterized by a state of charge representative of an amount of energy stored within the energy component and by an energy storage rate into and out of the energy storage component. At least one power input transfers electrical energy into the device for storage in the energy storage component. At least one power output transfers electrical energy out of the device from the energy storage component. A processor determines, for indication to a user, an estimate of time until the state of charge at least reaches one or more particular levels, the estimate determined at least from the state of charge in conjunction with the energy storage rate. The device can network with an external computing device and can generate solar adjustment information.

14 Claims, 9 Drawing Sheets

(56) References Cited

U.S. PATENT DOCUMENTS

| | | |
|---|---|---|
| 8,353,167 B2 | 1/2013 | McGann |
| 8,511,846 B1 | 8/2013 | Sandberg |
| 8,781,538 B2 * | 7/2014 | Morichi ............ H04W 52/0296 |
| | | 455/574 |
| 9,024,570 B2 | 5/2015 | Workman et al. |
| 9,124,099 B2 | 9/2015 | Kuriyama |
| 9,865,903 B1 * | 1/2018 | Petrella ............... H02J 2207/40 |
| 9,871,396 B2 | 1/2018 | Hansen et al. |
| 2008/0029153 A1 * | 2/2008 | Margalit ............... H02J 7/0047 |
| | | 136/252 |
| 2009/0025411 A1 | 1/2009 | Anderson |
| 2014/0195180 A1 | 7/2014 | Wojcik et al. |
| 2015/0084778 A1 | 3/2015 | Mittal et al. |
| 2015/0114024 A1 | 4/2015 | Grepper |
| 2016/0229437 A1 | 8/2016 | Jackman |
| 2017/0104335 A1 | 4/2017 | Williams |
| 2017/0236043 A1 | 8/2017 | Warmath et al. |
| 2018/0034267 A1 | 2/2018 | Vasefi et al. |
| 2019/0103805 A1 * | 4/2019 | Zhu ....................... H02J 7/0044 |

OTHER PUBLICATIONS

Office Action of the United States Patent and Trademark Office for U.S. Appl. No. 15/809,996, dated Nov. 27, 2018.

Tech Guru, Goal Zero Yeti 400 Lithium Review, Mar. 10, 2017, Nerd Techy—Your Guide to New Technology, https://nerdtechy.com/goal-zero-yeti-400-lithium-review.

* cited by examiner

ADVANCED MOBILE ENERGY STORAGE DEVICE

RELATED APPLICATION

The present Application is a divisional of U.S. application Ser. No. 15/668,866, filed on Aug. 4, 2017, and issued as U.S. Pat. No. 10,608,453 on Mar. 31, 2020, which is hereby incorporated by reference in its entirety.

BACKGROUND

The present Application relates at least generally to the field of mobile storage and supply of electrical energy and, more importantly, to an advanced mobile energy storage device and associated methods.

Applicants recognize there is a need for improvement in the supply of electrical energy in places and situations where connection to the electrical grid is inconvenient or impractical. Examples of these situations include construction sites, outdoor recreation such as camping, and emergencies such as the aftermath of storms. The prior-art has attempted to provide at least somewhat effective solutions using fossil fuel powered generators, with their incumbent detractions such as noise, exhaust, size, maintenance requirements, and the like. Portable generators for these situations usually supply a replacement grid connection: for example, 120-volt ac outlets. In addition, there has been a recent explosion in the market for mobile devices such as music players, LED lights, and wireless communication devices such as cellphones and tablets, among others. These mobile devices are typically powered by batteries, which need to be recharged, expanding the need and applications for the supply of electrical energy in off-grid situations.

Applicants further recognize that improvements in the size and cost of dc-to-ac converters, or inverters, have made practical the use of batteries to replace generators in these situations. A battery/inverter solution has many advantages over the detractions associated with fossil fuel powered generators: it is quiet, clean, more reliable, and can be much smaller, lighter, and more portable. Furthermore, recent improvements in battery chemistries have produced much higher energy storage densities, further enhancing the mobility of a battery/inverter supply. Batteries, even high energy density technologies, store only a finite amount of energy and therefore are in need of periodic recharge. The usual way this is done is with a charging circuit that is connected, at least temporarily, to the electrical grid, commonly through a 120-volt ac outlet. The charging circuitry can be incorporated into the same structure with the battery and inverter and this has led to the mobile energy storage device. The MESD (Mobile Energy Storage Device) has become a popular solution for applications ranging from single-digit watt, pocket-sized devices to multi-kilowatt generator replacements.

FIG. 1 is a block diagram that illustrates a prior-art mobile energy storage device, or MESD, generally indicated by the reference number 100. Electrical energy is stored in a rechargeable battery 101 of any suitable chemistry. The energy is made available for use by external devices on an ac power output 102, a USB (i.e., 5 volts) output 103, and a dc output (i.e., 12 volts) output 104. The battery can be recharged by connecting an ac power input 105 of the MESD to the electrical grid, (plugging it in to an electrical outlet). Some prior-art mobile energy storage device embodiments have an additional dc power input 106, frequently a 12-volt input suitable for connecting to the electrical system of an automobile, allowing recharging in locations without an electrical grid connection. Frequently, there are user controls 107 to provide functions such as the enabling/disabling of power outputs and the starting/stopping of recharging through the power inputs. There is also frequently a display 108 indicating to the user the status of the power inputs and outputs. The display can also indicate the state of charge (SOC) of the battery, i.e. the amount of energy stored within the battery. This is often indicated as a fraction of the capacity of the battery. Applicants observe that displaying the SOC when a mobile energy storage device is powering external devices can be of little value, as will be discussed at appropriate points below.

Applicants recognize that the prior-art has not addressed problems and concerns that have been swept aside by the advancements that have been brought to light hereinafter. Accordingly, the foregoing examples of the related art and limitations related therewith are intended to be illustrative and not exclusive. Other limitations of the related art may become apparent to those of ordinary skill in the art upon a reading of the specification and a study of the drawings.

SUMMARY

The following embodiments and aspects thereof are described and illustrated in conjunction with systems, tools, and methods which are meant to be exemplary and illustrative, not limiting in scope. In various embodiments, one or more of the problems described above and throughout this disclosure have been reduced or eliminated.

In one aspect of the present disclosure, an embodiment of an advanced mobile energy storage device and associated methods are described. The advanced mobile energy storage device includes an energy storage component for the storage of electrical energy and characterized by a state of charge representative of an amount of energy stored within the component and by an energy storage rate into and out of the energy storage component. At least one power input is provided through which electrical energy is transferable into the storage device for at least storage within the energy storage component. At least one power output is provided through which electrical energy is transferable out of the storage device from at least the energy storage component. A processor determines, for indication to a user, an estimate of time until the state of charge at least reaches one or more particular levels, the estimate determined at least from the state of charge in conjunction with the energy storage rate.

In another aspect of the present disclosure, another embodiment of an advanced mobile energy storage device and associated method are described. The advanced mobile energy storage device includes an energy storage component for the storage of electrical energy and is characterized by a state of charge representative of an amount of energy stored within the component and by an energy storage rate into and out of the energy storage component. At least one power input is provided through which electrical energy is transferable into the storage device for at least storage within the energy storage component. At least one power output is provided through which electrical energy is transferable out of the storage device from at least the energy storage component. A network interface is configured for communication over a wireless network with at least an external computing device. A processor cooperates with the external computing device to determine, for indication to a user, an estimate of time until the state of charge at least reaches one or more particular levels, the estimate determined is at least based on the state of charge in conjunction with the energy storage rate.

In still another aspect of the present disclosure, still another embodiment of an advanced mobile energy storage device and associated method are described. The advanced mobile energy storage device includes an energy storage component for the storage of electrical energy. At least one power output is provided through which electrical energy is transferable out of the storage device from at least the energy storage component. At least one power input is provided through which electrical energy is transferable into the storage device at least for storage within the energy storage component. A processor is configured to determine adjustment information, for use by a user of the storage device, to adjust a current orientation of a solar power source to a recommended orientation such that a predicted amount of solar energy collectable over a given time period subsequent to the adjustment is greater than another predicted amount of solar energy that would otherwise be collected at the current orientation for the given time period.

BRIEF DESCRIPTION OF THE DRAWINGS

Example embodiments are illustrated in referenced figures of the drawings. It is intended that the embodiments and figures disclosed herein are to be illustrative rather than limiting.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiments shown, but is to be accorded the widest scope consistent with the principles and features described herein including modifications and equivalents, as defined within the scope of the appended claims.

Figure 1:
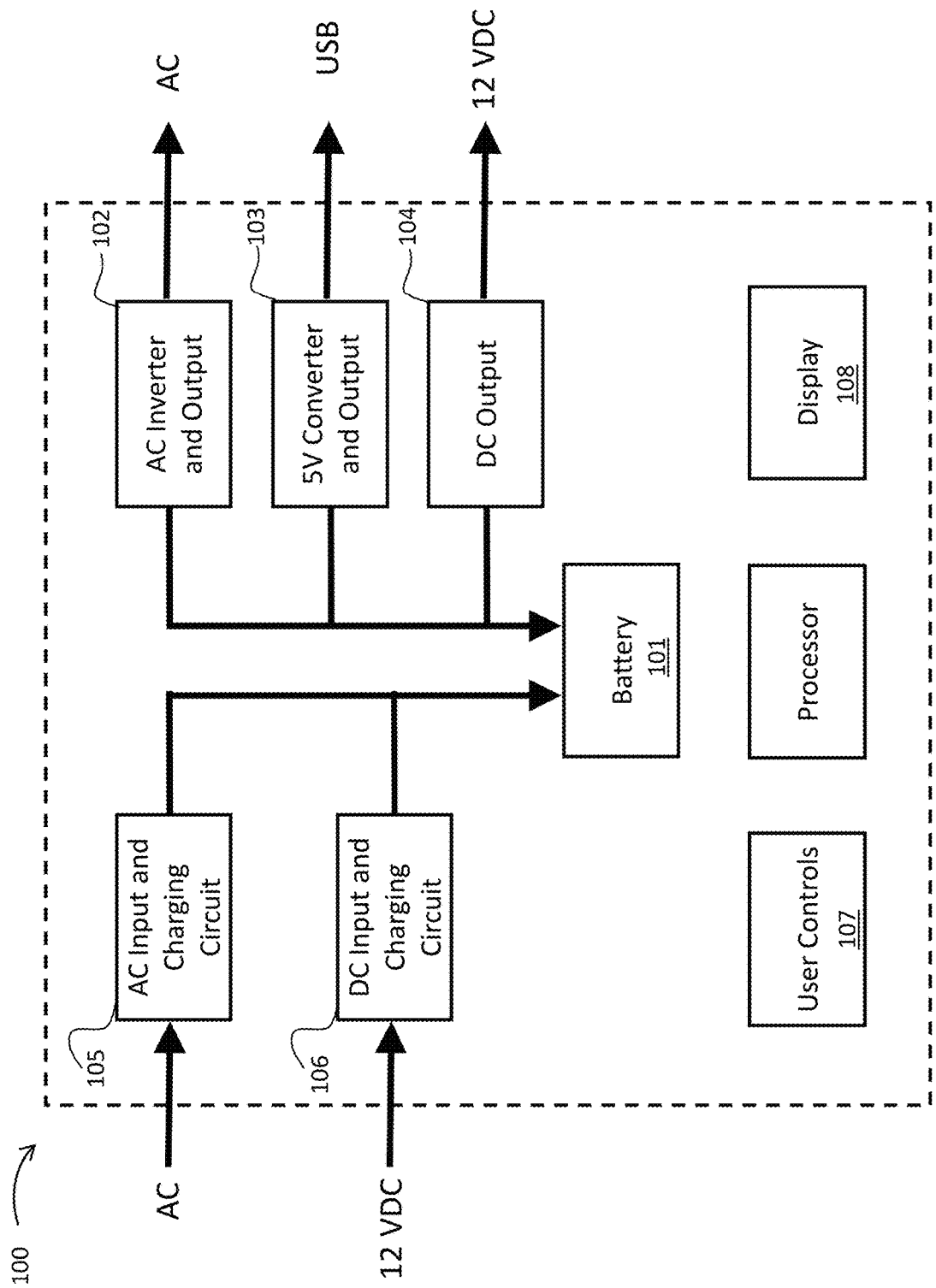
FIG. 1 is a block diagram generally illustrating an example of a prior-art mobile energy storage device (MESD).
Figure 2:
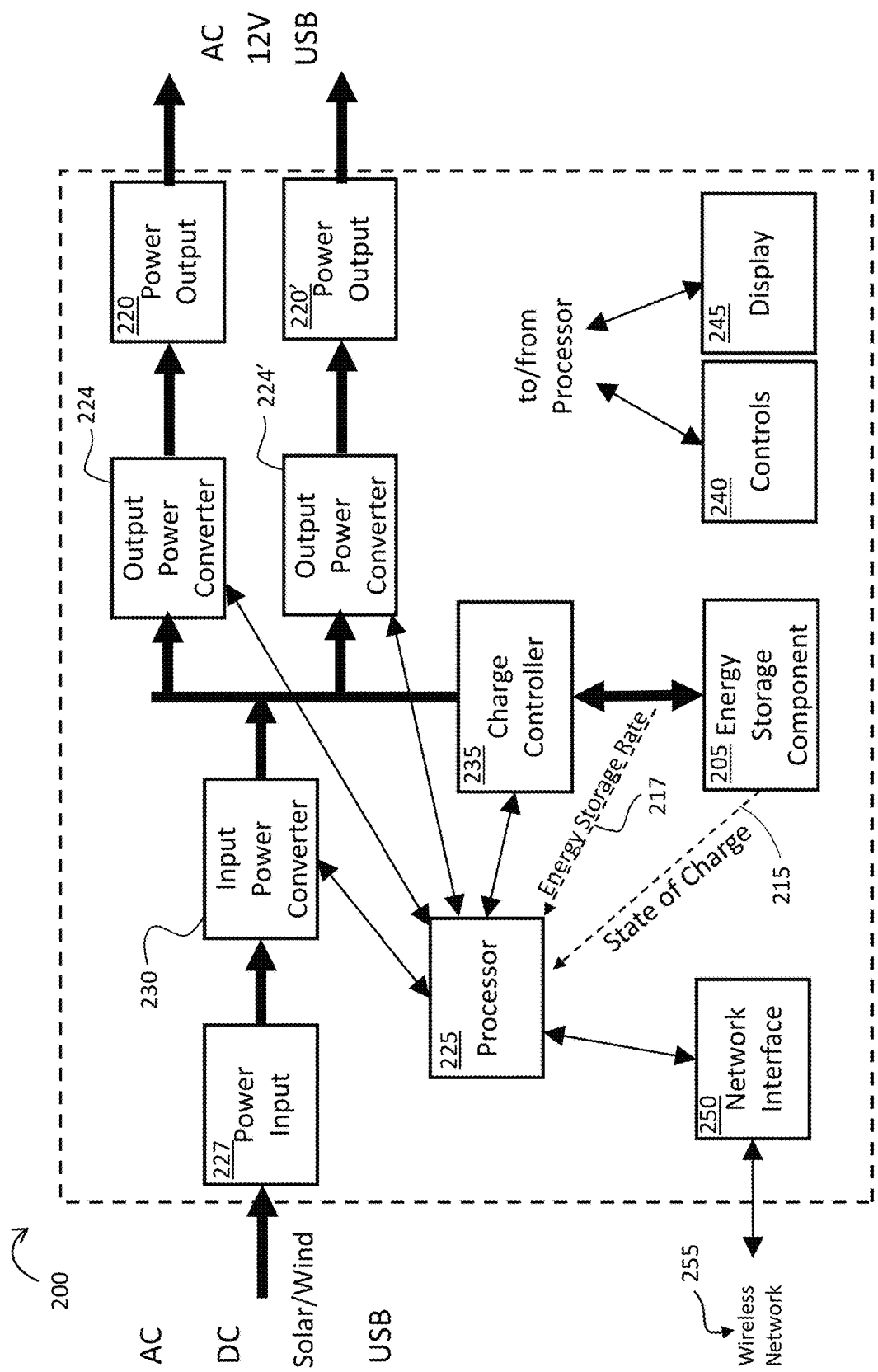
FIG. 2 is a block diagram of an embodiment of an advanced mobile energy storage device (AMESD) in accordance with the present disclosure.

Applicants hereby describe an Advanced Mobile Energy Storage Device, hereinafter AMESD. An AMESD stores electrical energy so that it can be supplied in locations where connection to the electrical grid or another source of electrical power is not possible or is inconvenient. Attention is directed to FIG. 2 which is a block diagram of an embodiment of an AMESD produced in accordance with the present disclosure and generally indicated by the reference number 200. Within the AMESD, electrical energy is stored in an energy storage component 205. It is noted that like reference numbers may be used to reference like components throughout the figures.

Energy storage component 205 is rechargeable: electrical energy can be transferred into it for storage before the AMESD is located on site, for example, at a location that is isolated from the power grid, and once on-site, electrical energy can be supplied for use by external device(s) by transferring electrical energy back out. (External powered devices are not shown in the figure). In one embodiment, energy storage component 205 is a 14.8-volt, 1250-watt-hour, rechargeable lithium-ion (Li—NiMnCo) battery and, in another embodiment, a 3.7-volt, 70-watt-hour, rechargeable lithium-ion (Li—Co) battery. Other battery technologies can be used, such as AGM (Absorbent Gas Mat) lead-acid and gel-cell lead-acid, without limitation. Applicants observe that flooded lead-acid batteries have a disadvantage; these batteries have limits on their orientation. Rechargeable energy storage technologies other than batteries can be used in energy storage component 205, each with their associated advantages and disadvantages. Other rechargeable technologies can include such things as supercapacitors and fly-wheels, without limitation.

Energy storage component 205 is characterized by an energy capacity and a state of charge 215, the latter of which is diagrammatically indicated as a monitoring line. The energy capacity indicates the maximum amount of energy that will be stored within energy storage component 205. This can be measured in any suitable energy units such as joules, amp-hours (assumes a fixed voltage), watt-hours, etc. State of charge 215 is representative of the amount of energy presently stored within energy storage component 205 and can be expressed relative to the energy capacity, frequently as a percentage. The energy storage component is also characterized by an energy storage rate 217, which is indicated by a monitoring line, of electrical energy into and out of the energy storage component. The energy storage rate can be measured in any suitable units such as joules/sec, watts, amps (assuming a fixed voltage), etc. The present disclosure will use a sign convention of positive for energy storage rate to indicate electrical energy is flowing into (charging) the energy storage component. Applicants note that the rate of flow of electrical energy can also be referred to as power. This disclosure preferentially uses energy terminology (and therefore flow of energy terminology) for consistency and clarity.

When AMESD 200 is used to supply electrical energy to external devices (not shown for purposes of illustrative clarity), the energy can be supplied by a power output through which electrical energy is transferrable out of the AMESD from energy storage component 205. Applicants note that throughout the present disclosure, in addition to the various forms of the term 'transfer through' when describing the flow of electrical energy through power outputs, the corresponding forms of the terms 'source' and 'supply' can be used interchangeably. There are two power outputs depicted in FIG. 2, indicated by reference numbers 220 and 220'. In other embodiments, the number of power outputs can be fewer or greater, depending on the application. Different types of power outputs can be used to supply different voltages and interconnections for different applications. For example, power output 220 can be one type: a conventional electrical outlet that supplies 120 volts ac. Power output 220' can be another type: one that provides 5 volts dc on a USB connector for applications such as recharging mobile electronics. In different embodiments, power outputs such as 220 and 220' can be other types, such as a standard 12-volt connector. (The standard 12-volt connector supplies high-power, high-current 12 volts dc that mimics an automotive power outlet). It should be noted that a power output of any particular type can have more than one connector, expanding the number of external devices to which the output can directly connect. It should be further noted that the examples provided are not intended to be limiting; practitioners skilled in the art will be able to provide other embodiments as applications warrant.

The electrical energy to power outputs 220, 220' can be supplied by output power converters. There are two output power converters depicted in FIG. 2, indicated by reference numbers 224 and 224'. In this embodiment, there is one output power converter for each power output, but this is not a requirement. Each output power converter can transform electrical energy into the appropriate voltage and current waveforms required for the power output being supplied. Power outputs can be protected against overloads and misconnections using well known techniques, such as current limiting, voltage clamping, and short-circuit protection. The protection circuits can be implemented in the output power converter and/or the power output.

Stored electrical energy can be provided to an output power converter (224 or 224') from energy storage component 205. In one embodiment, wherein the energy storage component comprises a 14.8-volt lithium-ion battery, this voltage is nominally 14.8 volts dc. The required function of the output power converter depends upon the requirements of the power output. If the power output supplies a dc voltage, then the output power converter can function as a power supply and techniques such as dc-to-dc converters can be employed. If ac voltage is supplied, then inverter technology can be used. In some instances, when no voltage level transformation is required, no output power converter need be utilized; the input power can be directly connected to an appropriate power output.

Each output power converter (224 or 224') can be controlled by a processor 225. The processor can enable or disable the output power converters, determining to which power output (220 or 220') electrical energy will flow. In some embodiments, more than one output power converter can be enabled simultaneously, allowing more than one power output to supply electrical energy at the same time. In addition to enablement, the processor can adjust an output power converter to control the characteristics of a power output. For example, in embodiments where the output power converter comprises a dc-to-dc converter, the duty cycle can be adjusted to control the voltage and current. In embodiments where the output power converter comprises an inverter, the processor can adjust the frequency, voltage level, and current level of the ac voltage supplied by the power output. The processor can also enable, disable and/or adjust the protection circuits discussed earlier.

Electrical energy can be transferred into AMESD 200 through a power input 227 for storage in energy storage component 205. Different types of power inputs can be used to accept electrical energy from different voltages and different interconnections. Applicants note that, when describing the flow of electrical energy through power inputs in the present disclosure, various forms of the terms 'accept' and 'receive' can be used interchangeably with corresponding forms of the terms 'transfer into' or 'transfer through'. One example type of power input can accept a standard 12-volt dc connector plug. This can allow the AMESD to be charged from automobiles. It should be noted that the voltage on standard 12-volt dc connectors can differ significantly from 12 volts. When an automobile is charging, for example, the voltage can run several volts higher. A different example type of power input can connect to 120 volts ac. In this type of power input, the use of an appropriate standardized receptacle, such as one compliant with IEC320 C13, can allow insertion of a detachable modular power cord for connection to a conventional electrical outlet. In still another type, a power input can accept power from a low dc voltage source such as, for example, 5 volts from a USB connector. In the embodiment of an AMESD depicted in the figure, only one power input is shown, although this is not a requirement. In other embodiments, two or more power inputs can be present that can be of different types.

Continuing to reference the block diagram of the AMESD 200 of FIG. 2, the electrical energy from power input 227 enters an input power converter 230. For purposes of illustration and not limitation, there is one input power converter depicted. Other embodiments can comprise more than one input power converter. Embodiments can have one input power converter for each power input, as depicted in the figure, or the numbers can differ. In some embodiments, multiple power inputs can share a single input power converter. In other embodiments, multiple input power converters can be connected to a single power input. Input power converter 230 can transform electrical energy so that the energy is appropriate for transfer into energy storage component 205 for storage. In one example embodiment, energy storage component 205 is a 14.8-volt lithium-ion battery. Input power converter 230 can use well-known power supply technology, such as dc-to-dc switching converter technology, to transform the voltage level from power input 227 to the 14.8 volts needed at the energy storage component. When the power input accepts ac voltages, corresponding input power converter 230 can use appropriate known techniques for transforming the voltage to dc before transferring the electrical energy to energy storage component 205 for storage. Such techniques can include, without limitation, rectification, filtering and dc-to-dc conversion. The input power converter can be protected against damage from over-voltages and reverse voltages by use of customary protection circuits. These protection circuits, such as diode voltage clamps and transorbs, can be placed in the power input or the input power converter.

Input power converter 230 can be controlled by processor 225. The processor can control input power converter(s) in ways that are similar to the control of output power converters, as discussed earlier. The processor can enable or disable individual input power converters, such as input power converter 230. Processor 225 can also adjust the acceptable voltage range for power inputs, such as power input 227, and the voltage supplied to energy storage component 205. In embodiments where the input power converter employs a dc-to-dc converter, this can be accomplished, for example, by adjusting the duty cycle of the dc-to-dc converter. The processor can also enable, disable and/or adjust the input protection circuits discussed above.

Continuing the discussion of FIG. 2, the electrical energy leaving input power converter 230, now at the appropriate voltage, passes through a charge controller 235. The charge controller, in an embodiment with assistance from processor 225, monitors state of charge 215 of the energy storage component 205. Suitable arrangements for monitoring the state of charge depend on the technology choice for the energy storage component. For example, if an embodiment of an AMESD 200 uses a super-capacitor for the energy storage component 205, the amount of stored energy is proportional to the square of the voltage across the super-capacitor. Accordingly, the charge controller 225 can determine the state of charge by measuring the voltage across the energy storage component 205.

In another embodiment, energy storage component 205 is a lithium-ion battery. There are many well-known techniques that can be used to determine state of charge 215 by measuring the voltage across and/or the current into and out of the energy storage component 205, each with their individual advantages and disadvantages. One of these techniques, coulomb counting, can be used by measuring the current through the charge controller 235 as it enters and leaves the energy storage component 205. The current can be integrated over time by processor 225 to determine the amount of charge (measured in coulombs or amp-hours) remaining in the energy storage component. The ratio of this result to the energy capacity determines the state of charge. Energy storage rate 217 can also be determined by measuring the current through charge controller 225 using the equation Energy Storage Rate=Power=Battery Voltage*Current.

Processor 225 and charge controller 235 can cooperate to control the charging process for energy storage component 205. The charging rate, i.e. energy storage rate 217 of electrical energy into the energy storage component, can be measured in the charge controller and fed-back by the processor to input power controller 230. In embodiments where the input power controller is comprised of a dc to dc converter, this can be accomplished by adjusting the duty cycle of the converter using well understood control system techniques. The energy storage component can be prevented from overcharge by monitoring state of charge 215 and halting or reducing the input power converter. Additionally, the processor can vary the charge rate as the state of charge increases in a similar way.

As previously discussed, when power is being supplied to AMESD 200, energy flows out of input power converter 230 and into (charging) energy storage component 205. In this case, energy storage rate 217 is positive. When the AMESD is supplying power, the energy flows out of (discharging) the energy storage component and into output power converter 224 and/or 226, depending on which power outputs 220 and/or 222 are energized. In this case, the energy storage rate is negative. The AMESD can be both charging and supplying power at the same time. Energy storage rate 217 is the net flow rate of electrical energy into or out of energy storage component 205. The rate can be positive or negative depending on whether the charging energy flow rate is greater than the discharging energy flow rate, i.e. whether the energy is being supplied out from the power output faster than the energy is being sourced in through the power input. In embodiments of the AMESD with multiple power inputs and/or power outputs, electrical energy can flow inward from one or more input power converters and outward into one or more power converters. The energy storage rate is the sum of the positive energy flow rates from the energized input power converters and the negative energy flow rates into the energized output power converters, neglecting any losses.

AMESD 200 can have a network interface 250 allowing it to connect to a wireless network 255, such as WiFi or Bluetooth, allowing the AMSED to communicate with other devices (not shown). The wireless network can also include a direct radio link to another device. In this embodiment, the network interface is controlled by processor 225. Connection to a wireless network can allow the AMESD to be controlled by and communicate status to some other device on the network (not shown). Connection to a wireless network can also allow the AMESD to connect through it to the internet (not shown), as will be discussed in greater detail later in the present Application.

Controls, indicated by reference number 240, can allow the user to control and configure the AMESD. The controls can be positioned in any suitable location such as, for example, on the front panel of AMESD 200. Examples of functions performed by controls 240 can include turning on (enabling) and turning off (disabling) specific power inputs 227 and power outputs 220 and 222, enabling and disabling protection input/output protection circuits and features, and changing parameters such as setting the maximum current (power) levels for power inputs and outputs.

Processor 225 can indicate to the user the status of the AMESD via a display 245. The status displayed can include, for example, indicating which power inputs and power outputs are currently enabled and the flow rate of electrical energy (power) through them. The operating state of energy storage component 205 can also be indicated, such as the energy storage rate 217 and state of charge 215. Controls 240 can be combined with the display in the form of a touchscreen: allowing the user to conveniently control functions (such as enabling, disabling, changing parameters) by touching an icon on the display rather than by interacting with a separate button, switch, or dial.

Figure 3:
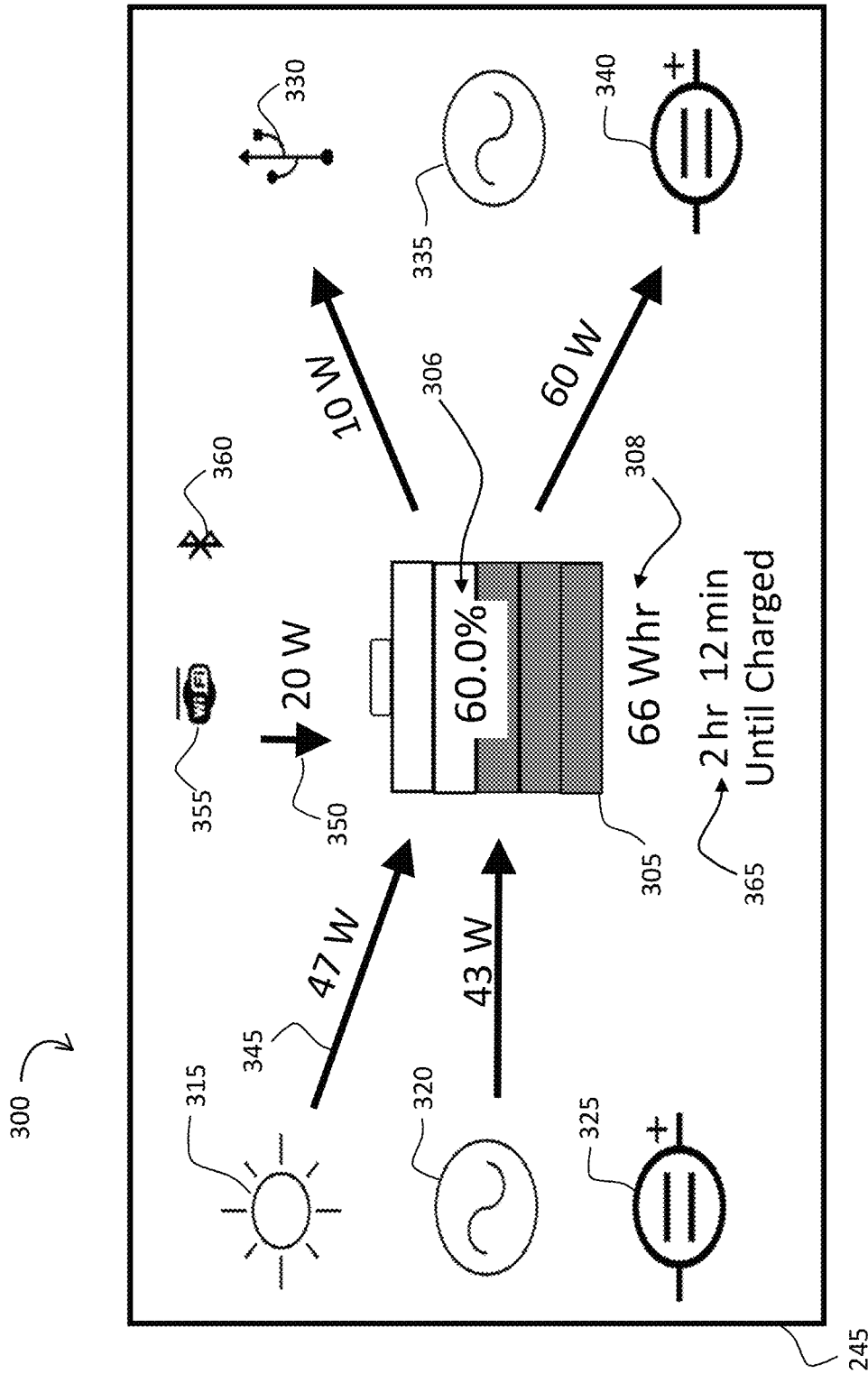
FIG. 3 is a diagrammatic representation of an embodiment of a screen shot of the display of an advanced mobile energy storage device (AMESD) produced in accordance with the present disclosure.

The reader's attention is now directed to FIG. 3, which depicts an embodiment of a screenshot 300 of display 245, (which can be a touch-screen). A practitioner of ordinary skill in the art will realize that the display screenshot depicted is just one of a great many possible that are in keeping with the teachings and spirit of this Application and that the specifics of this example should in no way be considered as limiting. The screen depicts a diagrammatic representation of AMESD 200 (FIG. 2). In the center of the screen, an icon of a battery 305 represents energy storage component 205 (FIG. 2). A percentage 306 in battery icon 305 and a watt-hour indication 308 indicate state of charge 215 (FIG. 2) of the energy storage component. Battery bars that form part of battery icon 305 can utilize color to indicate the state of charge, for example, with green indicating available energy. In the present example, icon 305 depicts a 60% state of charge which equates to 66 watt hours of energy. The energy storage component of the present embodiment has a capacity of 120 watt-hours, of which 66 watt-hours is 60%. Icons identified by reference numbers 315, 320, and 325 represent the Solar, AC, and 12V DC power inputs into the AMESD respectively. Likewise, icons identified by reference numbers 330, 335, and 340 respectively represent USB, AC and 12V DC power outputs, respectively. These icons can individually indicate the state of the corresponding input or output visually, such as by graying out or changing color when not enabled. Arrows can be used to indicate energy flow. For example, an arrow 345 indicates energy flow from the solar power input into the energy storage component. When energy flow is present, arrow 345 can be displayed, pointing in the appropriate direction. When no energy is flowing, the arrow can be greyed out or blanked. The thickness or boldness of the arrow can correspond to the amount of energy that is flowing. In other embodiments, the arrow can blink or animate to indicate that energy is flowing, the blink rate or animation speed indicating the amount of energy flow. Arrows can be labeled to indicate the amount of energy flowing. In the present embodiment, arrow 345 indicates that 47 watts is currently flowing from the solar power input to the energy storage component. It is noted that the flow relating to any electrical energy path within the AMESD can be illustrated in accordance with these as well as any other suitable conventions. For example, an arrow 350 can indicate the direction and magnitude of the energy storage rate. (The energy storage rate is the net amount of energy flowing into or out of the energy storage component. See reference number 217 in FIG. 2). Arrow 350, in this instance, indicates a net inward flow and the label on the arrow indicates 20 watts of electrical energy is flowing.

Display 245 can also use icons to indicate network connectivity. For example, in screenshot 300 in FIG. 3, the depiction of a Wifi icon 355 and a Bluetooth icon 360 can indicate that the AMESD is connected to the corresponding wireless network. The icons can also be blanked, grayed out, or change color to indicate the status of the network connection, such as disconnected or error.

Having described aspects of embodiments of the advanced mobile energy storage device of the present disclosure in detail above, it is appropriate at this juncture to now bring to light certain deficiencies of the prior-art that are submitted to remain unresolved and which are addressed herein with regard to indicating the State of Charge (SOC) to the user. For example, when recharging an AMESD, it is of interest to the user to know the amount of time remaining until the AMESD is charged and can be disconnected and put into use. This time can be difficult to estimate as the recharge rate can be limited by the AMESD (for instance by the battery technology being used) and/or by the power source to which it is connected. Applicants additionally note that the estimation of such times can be further complicated when the AMESD is being used to power an external device while it is being charged, or when multiple external devices are in use at the same time, or when multiple power sources are being used to recharge at the same time. As another example, when an AMESD is supplying power to an external device, one cannot rely on the listed or label power rating of the external device since this value is usually an absolute maximum value and not a good indication of the actual power being used. As will be discussed immediately hereinafter, Applicants believe that these concerns have been resolved.

Continuing now with reference to FIG. 3, display 245 can also indicate an estimate of time 365 until the energy storage component's state of charge reaches a particular level. In the example screen depicted, the estimate of time illustrated is 2:12 (2 hours 12 minutes). This indicates, by way of non-limiting example, that the time remaining until the state of charge equals the particular level of 100%, (i.e. the energy storage component is fully charged), is estimated to be 2 hours and 12 minutes.

In one embodiment, estimate of time 365 can be based on the assumption that energy storage rate 217 (FIG. 2) will continue at its present value. In this case, future values of state of charge 215 (FIG. 2) can be estimated using a first order approximation. Applying the particular level that the state of charge needs to reach to this approximation results in an equation the can be implemented by processor 225 to calculate the estimate of time. For the particular levels of full and empty, this results in implementing the following equations:

$$t_{empty}[\sec] = \frac{SOC}{r_{storage}}\left[\frac{\text{joules}}{\text{joules/sec}}\right] \qquad \text{[EQN 1]}$$

$$t_{full}[\sec] = \frac{\text{Capacity} - SOC}{r_{storage}}\left[\frac{\text{joules}}{\text{joules/sec}}\right] \qquad \text{[EQN 2]}$$

where:
$t_{empty}$=time remaining until stored energy=0 [units=sec]
$t_{full}$=time remaining until stored energy=max [units=sec]
SOC=State Of Charge (amount of stored energy) [units=joules]
$r_{storage}$=rate of energy into storage [units=joules/sec (watts)]
Capacity=max energy that can be stored [units=joules]

When supplying energy to various devices, the amount of current drawn by the devices can change. Even with the output voltage held constant, changing current changes the power (rate of energy flow) supplied and therefore affects estimate of time 365. These changes can take place over a longer time scale as the function of the device consuming the energy changes. For example, starting or stopping a tool, or turning on a light, can change the power for a time-period of seconds or minutes, affecting energy storage rate 217 (FIG. 2) over a long time scale. Changes to the current drawn from the AMESD can also occur over shorter time scales. For example, the current drawn by sections of circuitry as they are used and unused can vary over a time scale of 10's of milliseconds or shorter.

Figure 4:
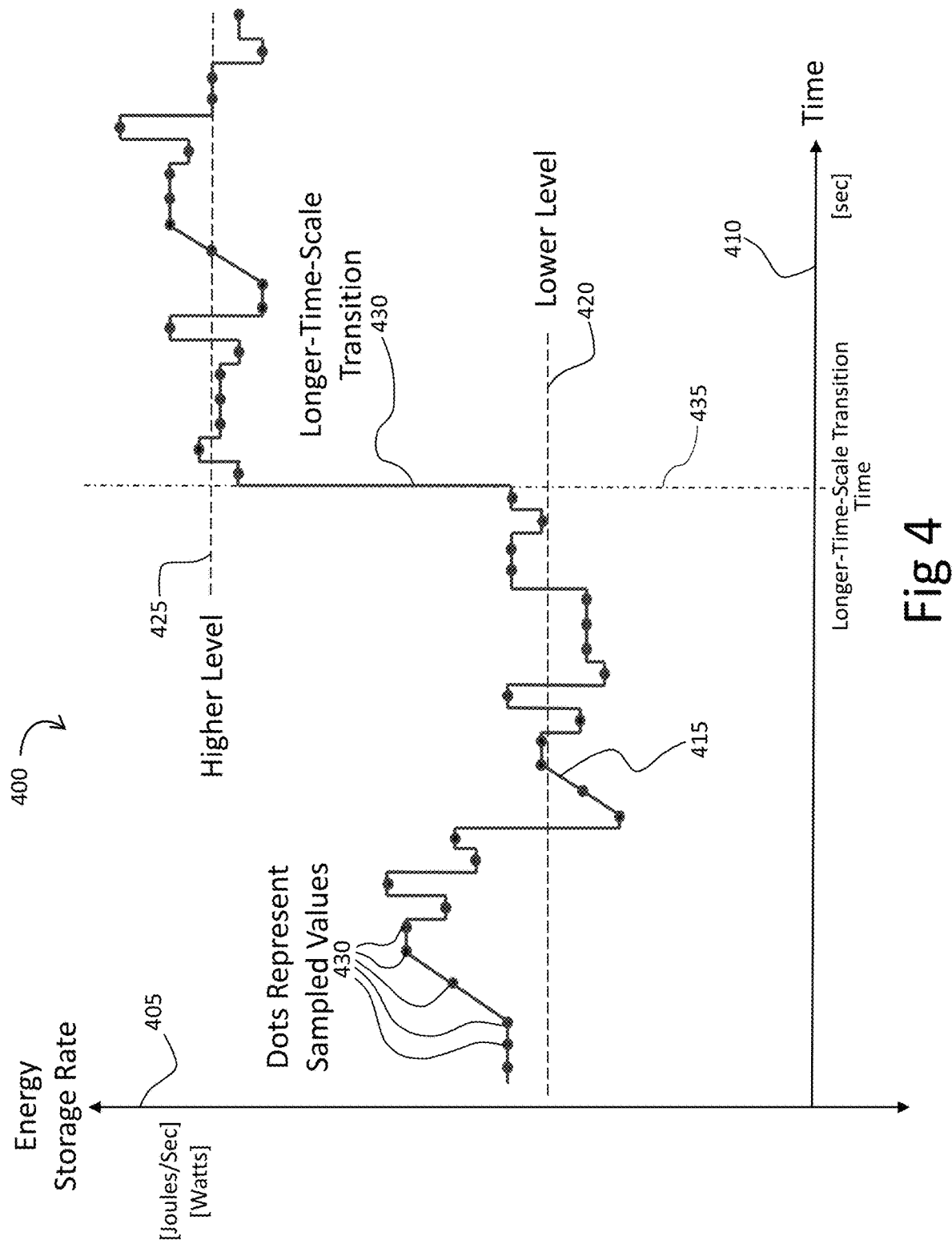
FIG. 4 is a graph of the rate of energy flow as a function of time illustrating various features of an example waveform of the energy storage rate in an embodiment of an advanced mobile energy storage device (AMESD).

Referring now to FIG. 4, a graph 400 of energy storage rate 217 (FIG. 2) for an embodiment of an AMESD is shown. Vertical axis 405 indicates, at some appropriate scale, the energy storage rate [joules/sec or watts] at each point in time. Horizontal axis 410 indicates time [sec], also at some appropriate scale. A waveform 415 is shown as a solid line that represents the instantaneous values of the energy storage rate at each point in time. Average level lines 420 and 425, depicted as dashed horizontal lines, each indicate an average value of the energy storage rate. Lower average level line 420 indicates an approximate average of the energy storage rate during an initial portion of waveform 415. Higher average level line 425 indicates the approximate average during the later portion of the waveform.

In the earlier discussion, with reference to FIG. 2, embodiment 200 of the AMESD measures energy storage rate 217 in charge controller 235. This can be implemented as an A-to-D (Analog to Digital converter) that measures samples of the instantaneous energy storage rate at spaced apart points in time. The charge controller can report the measured samples to processor 225, which can use these values to determine estimate of time 365 (of FIG. 3) for indication to a user of the AMESD on display 245.

Returning to the graph of FIG. 4, measured samples 430 of the instantaneous energy storage rate are indicated by dots on waveform 415. Applicants observe, in this example, waveform 415 shows that energy storage rate 217 (FIG. 2) changes significantly over the shorter time scale of sample to sample. If estimate of time 365 is determined for every sample of the energy storage rate, then the estimate will constantly change, making it difficult for the user to comprehend. Processor 225 can instead determine the estimate of time using a series of measurement samples, such as by determining an average of the previous M samples, where M can be chosen to reduce the amount of variation to an acceptable level.

Applicants further observe that the example waveform of FIG. 4 also contains, in addition to the shorter time scale changes just discussed, a significant change over a longer time scale. At time 435, the short term average of samples changes from lower average level 420 to a different, higher average level 425. This change can occur, for example, when a functional change occurs in the device supplied with energy from power outputs 220 and/or 222. Examples of such a functional change can include a tool starting or stopping, a light turning on, or other even more complex changes. The change can also occur if the topology of the energy flow changes, such as when an additional power input or power output is enabled or disabled. If the average of the previous M samples of the energy storage rate is used to determine the estimate of time, as just discussed, the estimate indicated to the user will slowly ramp from one value to another as the average smooths the step transition. When a transition occurs, the estimate of time can be delayed and be less accurate, making it more difficult for such a functional change to be noticed by the user.

Estimate of time 365 (of FIG. 3) can be further improved with processor 225, in addition to calculating the average over the previous M samples, also continually determining the standard deviation of the previous M' samples. (M and M' are not necessarily the same number of samples and the value of each can be determined empirically in the specific application of an embodiment). When a measured sample of energy storage rate is observed that differs in some multiple, for example, of the continually determined standard deviation, the average value can be reset to the current (i.e., latest) measured sample value of energy storage rate. This causes the estimate of time to quickly respond to a longer time scale transition. The multiple just mentioned can be a non-integer value and can be chosen based on the statistical distribution of the short time frame variation. In this way, the probability of falsely detecting a transition can be reduced to an acceptable level.

Figures 5A, 5B:
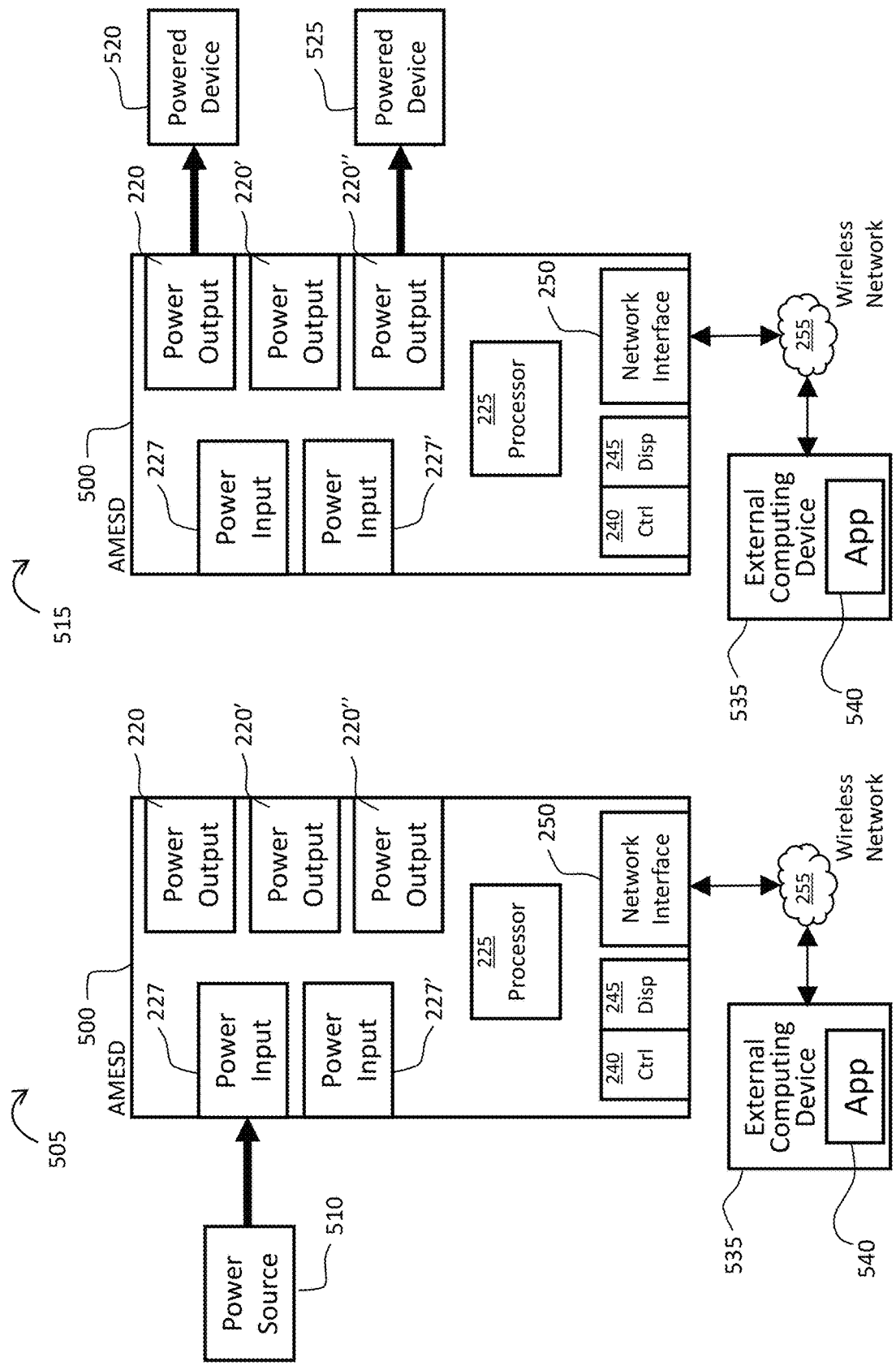
FIG. 5A is a block diagram of an embodiment of a mobile energy storage system incorporating an AMESD and configured for charging from a power source in accordance with the present disclosure.
FIG. 5B is a block diagram of another embodiment of a mobile energy storage system incorporating the AMESD of FIG. 5A and being used to supply electrical energy to powered devices in accordance with the present disclosure.
Figure 5C:
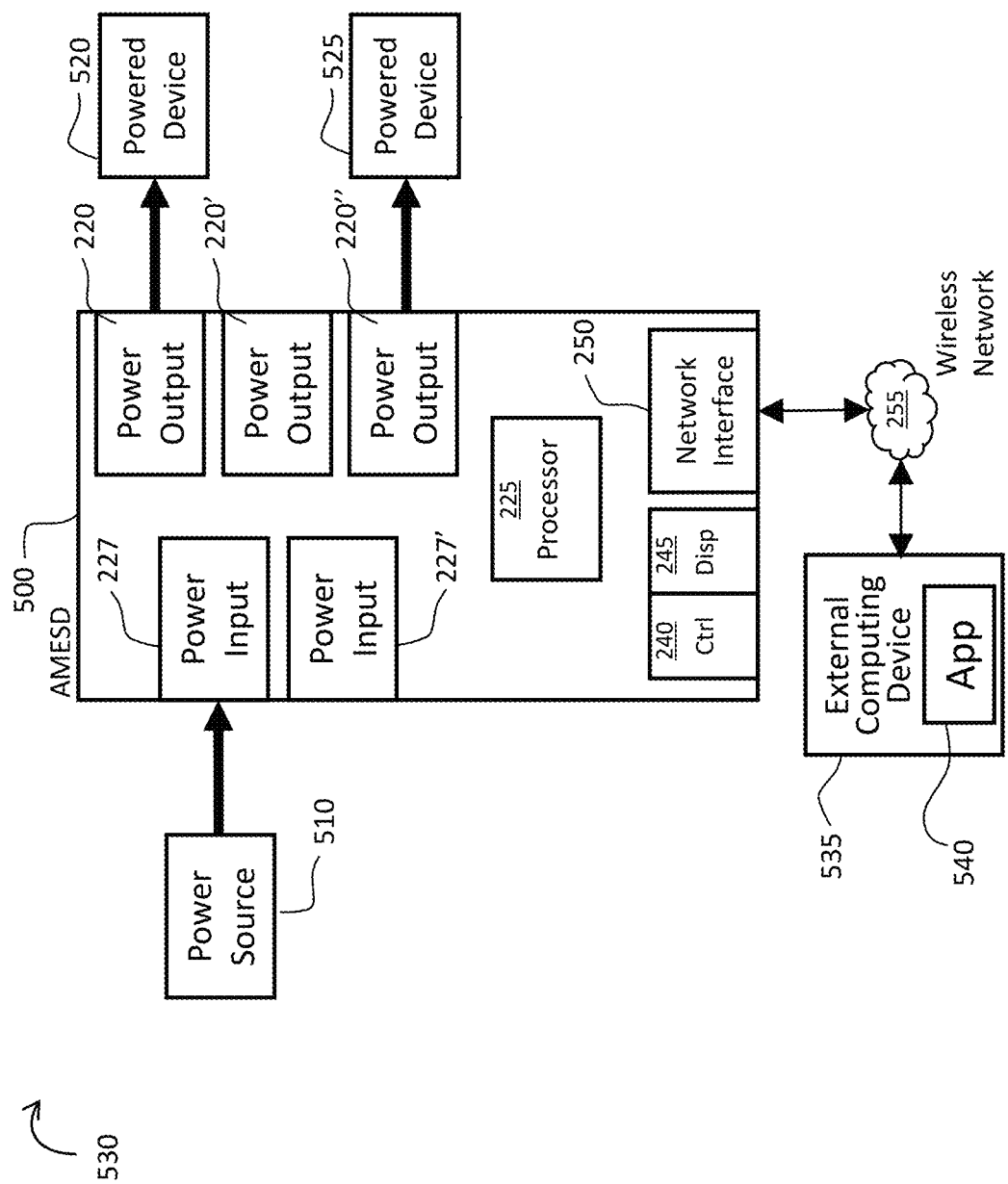
FIG. 5C is a block diagram of still another embodiment of a mobile energy storage system incorporating the AMESD of FIGS. 5A and 5B, that is concurrently receiving and supplying electrical energy in accordance with the present disclosure.

The discussion turns now to FIGS. 5A, 5B, and 5C, each of which depict a block diagram of a mobile energy storage system incorporating an AMESD (Advanced Mobile Energy Storage Device). The AMESD in these figures is indicated by reference number 500 and is another embodiment, in accordance with the present disclosure, of the AMESD that was discussed earlier with respect to FIG. 2. (The embodiment of the AMESD in FIG. 2 is indicated by the reference number 200). In these diagrams, AMESD 500 can include the structure of previously described AMESD 200 of FIG. 2. Accordingly, the present descriptions will be limited to describing differences and the figure is likewise limited to illustrating those differences with components that are not explicitly shown in FIGS. 5A, 5B, and 5C being understood to be present for purposes of brevity.

AMESD 500 depicted in FIGS. 5A, 5B and 5C has two power inputs 227, 227' and three power outputs 220, 220', 220". As mentioned in the earlier discussion, other embodiments of the AMESD can have different numbers of power inputs and power outputs. There can be different types of power inputs and power outputs. In this embodiment of the AMESD, power input 227 is a type configured to receive 120 volts ac electrical energy and power input 227' to receive high current 12 volts dc. Power output 220 is a type configured to supply 120-volt ac electrical energy, power output 220' to supply high current 12 volts dc, and power output 220" to supply 5 volts dc on a USB connector. In different embodiments, the power inputs 227 and 227' and power outputs 220, 220' and 220" can be other types. Corresponding appropriate input power converters and output power converters, as discussed regarding FIG. 2, can be present and are not shown for purposes of brevity and clarity.

Focusing on FIG. 5A, the block diagram of a mobile energy storage system incorporating AMESD 500 is presented and is generally indicated by reference number 505. This embodiment is an example of a mobile energy storage system that can be used for charging an AMESD 500. Mobile energy storage system 505 is configured so that the AMESD receives electrical energy only through power input 227 and power input 227' is disconnected. Power input 227 is connected to a power source 510 and electrical energy can be transferred from the power source into the AMESD through power input 227 for storage within the energy storage component 205 (shown in FIG. 2) of the AMESD. The power source can be a device capable of supplying electrical energy that is configured in such a way as to be compatible with the power input to which it is connected. In this embodiment, the power source can supply 120 volts ac, such as an electrical grid outlet or the output of a portable electric generator. The AMESD also comprises power outputs 220, 220', and 220" through which electrical energy is transferable out of the AMESD from the storage component. In this embodiment, the AMESD is only being charged and is not being used to power any device: power outputs 220, 220', and 220" are not connected.

Moving to FIG. 5B, the block diagram of another embodiment of a mobile energy storage system incorporating the same AMESD 500 is generally indicated by reference number 515. This embodiment is an example of a charged AMESD being used to supply electrical energy. The AMESD in this embodiment is supplying electrical energy to two devices: a powered device 520 and a powered device 525. These powered devices are each respectively connected to power outputs 220 and 220" of the AMESD. Electrical energy can be transferred from energy storage component 205 of the AMESD (shown in FIG. 2) through power output 220 and/or 220" and into powered device 520 and/or 525. Mobile energy storage system 515 is not configured to use power output 220' of the AMESD and it is not connected. A powered device can be configured in such a way as to be compatible with the power output to which it is connected so that it is capable of receiving electrical energy. In this embodiment of the AMESD, power output 220 is configured to supply 120-volt ac electrical energy. Powered device 520 can be configured compatibly, such as a device that can plug into the 120-volt ac power grid. Power output 220" is configured to supply 5 volts dc on a USB connector.

Powered device 525 can be configured compatibly, such as cell phone that is rechargeable through a USB connector. The AMESD also comprises power inputs 227, and 227' through which electrical energy is transferable into the AMESD for storage within the storage component. However, this embodiment of a mobile energy storage system is not configured to be charged: power inputs 227 and 227' are disconnected.

FIG. 5C is a block diagram of still another embodiment of a mobile energy storage system incorporating the same AMESD 500, this one generally indicated by reference number 530. This embodiment is an example of an AMESD suppling electrical energy to powered devices 520 and 525 while at the same time receiving electrical energy from power source 510. The power source and powered devices and their corresponding power input and power outputs have been described in the preceding paragraphs regarding FIGS. 5A and 5B.

A detailed explanation of the operation of the power inputs and the power outputs of the AMESD in FIGS. 5A, 5B, and 5C, as well as for the other functional blocks shown comprising the AMESD, can be found in an earlier discussion regarding FIG. 2. Summarizing from that earlier discussion, processor 225 can cooperate with controls 240 and display 245 to allow the user of the mobile energy storage system to interact with the processor to control and monitor the operations of the AMESD. The processor can cooperate with network interface 250 that can be connected to a wireless network 255. The processor can communicate over the wireless network with other devices connected to the network. The wireless networks of mobile energy storage systems 505, 515, and 530 shown in FIGS. 5A, 5B, and 5C, are each connected to an external computing device 535, allowing the processor to communicate over the network to the external computing device. The external computing device can cooperate with the processor to allow the user to control and monitor the operations of the AMESD. This cooperation can result in additional types of interactions. For example, in some embodiments, it can result in the external computing device functioning as controls 240 and display 245, replacing the need for those functions in the AMESD and thereby reducing its cost and size. In other embodiments, the external computing device can duplicate some or all of the functions of the controls and display. This can allow remote control of the AMESD as well as local control. The external computing device and the processor can also cooperate to perform functions that are presently attributed to just the processor. This allows computation to be off-loaded to hardware with more resources such as larger memory, faster processing, a global positioning system (GPS) receiver, and access to the internet.

External computing device 535 can be an application specific design. It can also be a commercially available product such as a laptop computer, tablet, smart phone, or cell phone. (This list is not intended to be complete or limiting, practitioners knowledgeable in the art will be able to apply the teachings of this Application to other embodiments). The functions of the external computing device can be implemented by an embedded processor executing a program (a sequence of programmed instructions) stored within the device, such as firmware. The functions can also be implemented by the execution of an app 540. The app (short for application) is a program or set of programs that can be loaded onto the device as an integral unit and is designed to perform a group of coordinated functions or tasks. The app can be downloaded into the external computing device over the internet, providing the device has an internet connection, such as through a cellular link (not shown) or through wireless network 255 to an internet gateway device (not shown).

Applicants recognize that with the on-going reduction in prices of solar (photovoltaic) panels, their use has become more practical and common. Solar panels provide another viable alternative for power in off-grid situations. However, a well-known limitation of solar panels is that the power produced varies throughout the day with the position of the sun, and varies less deterministically with weather determined sky conditions. Attaching an AMESD to a solar power source allows the energy storage to 'level out' these variations and provide a more reliable and predictable source of power. In addition, the compact size and relative light weight of solar panels render them reasonably portable making them appropriate for more mobile applications where they can be used to recharge the AMESD. In these applications, time-until-discharged and the time-until-charged are again of interest to the user. However, as should be readily apparent to one of ordinary skill in the art, the additional variability from a solar power source increases the difficulty in such determinations.

Figure 6:
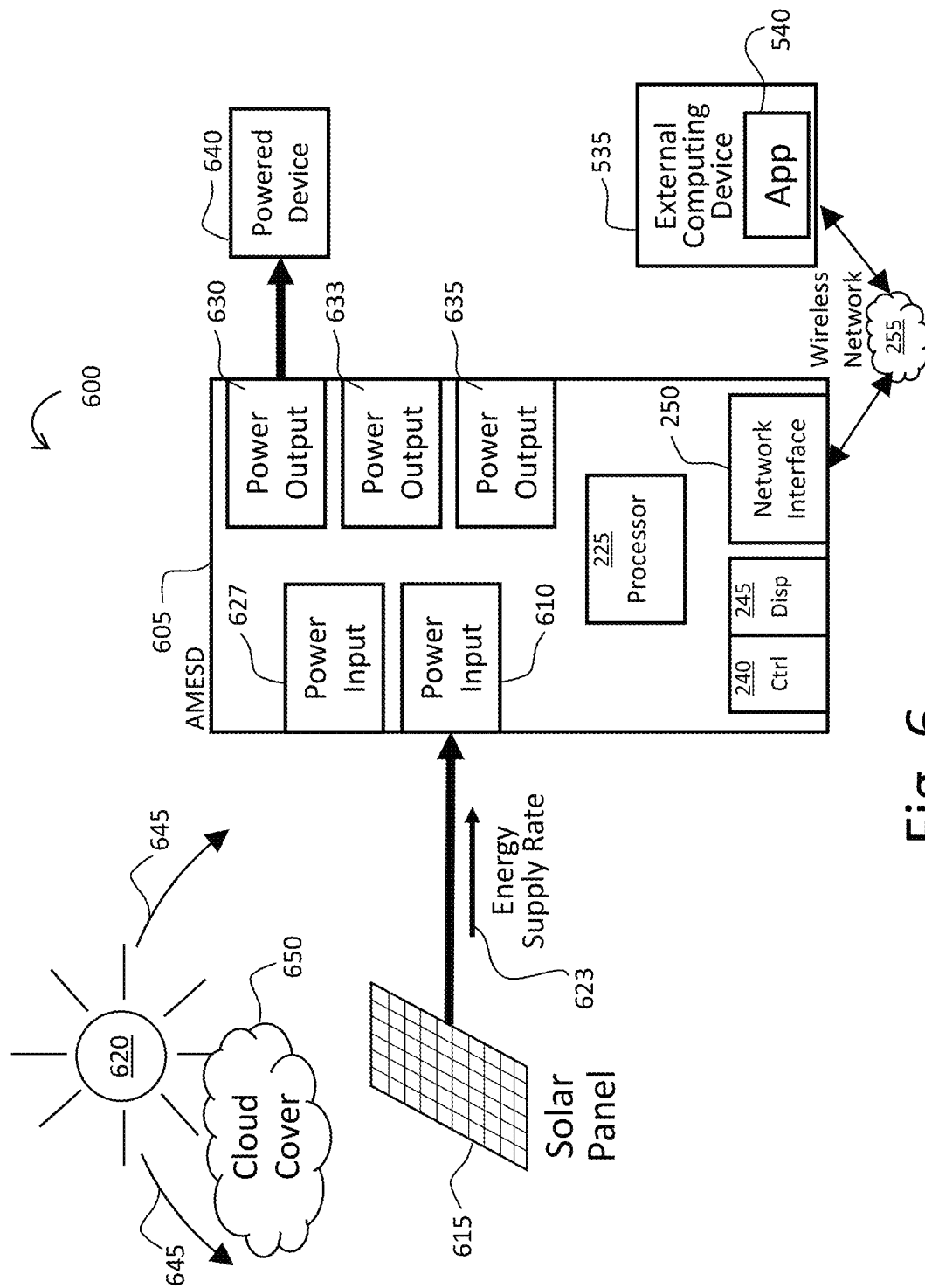
FIG. 6 is a block diagram of a mobile energy storage system incorporating an embodiment of an AMESD that is using an environmental power source to harness energy from the environment in accordance with the present disclosure.

Focusing attention now on FIG. 6, a block diagram for another embodiment of a mobile energy storage system 600 is presented that includes an AMESD 605. Similar to AMESD 500 in FIGS. 5A, 5B, and 5C, AMESD 605 is another embodiment, in accordance with the present disclosure, of the AMESD that was discussed earlier with respect to FIG. 2. (The embodiment of the AMESD in FIG. 2 is indicated by the reference number 200). In these diagrams, AMESD 605 can include the structure of previously described AMESD 200 of FIG. 2. Accordingly, the present descriptions will be limited to describing differences and the figure is likewise limited to illustrating those differences with components that are not explicitly shown in FIG. 6 being understood to be present for purposes of brevity.

Mobile energy storage system 600 can use energy from the environment to 'charge' (i.e., supply electrical energy to) AMESD 605. In the embodiment depicted, the chosen environmental energy is solar and such an arrangement can also be used to perform the 'leveling out' referred to above. A power input 610 of AMESD 605 can be connected to an environmental power source 615. The environmental power source can receive energy from an environmental energy source 620, which the power source can convert into electrical energy that can be supplied to the power input. In this embodiment, the environmental energy source is the sun which supplies solar energy to a solar panel that comprises the environmental power source. For the sake of clarity, environmental power source 615 can also be referred to as solar panel 615 or simply as the solar panel. Likewise, environmental energy source 620 can also be referred to as sun 620 or simply as the sun. In other embodiments, the environmental power source can use some other solar to electrical energy technology. In still other embodiments, a different environmental energy source 620, in conjunction with an appropriate environmental power source 615, can be used. In one example embodiment, the environmental energy source can be the wind and the environmental power source can be a wind driven turbine powering an electrical generator. Other examples can include water turbines that generate power from moving water (e.g. creek or stream) or a thermoelectric generator that can generate electrical energy from a temperature difference, such as between a campfire and the air. It should be noted that a mobile energy storage system, with an appropriately configured AMESD, can be connected to and receive electrical energy simultaneously from combinations of multiple power sources and/or environmental power sources.

Solar panel 615 receives solar energy from sun 620, which the panel converts to electrical energy that is supplied to AMESD 605 through power input 610. The rate at which the electrical energy is supplied from the solar panel to the AMESD can be characterized by an energy supply rate 623. Applicants observe that, unlike many sources of electrical energy which have low output impedance, the voltage produced by an environmental power source can have significant impedance; the voltage produced can vary significantly with the amount of current being supplied. Environmental power sources 620 usually exhibit a single operating point of voltage and current that maximizes the electrical energy supplied. The maximum energy operating point can be very sensitive to changes in the operating parameters of the environmental power source, such as temperature and energy input level, that can make the conversion efficiency of simple, static designs for power input circuits inefficient. Solar panels usually exhibit this high output impedance effect. Practitioners with experience in interfacing with solar panels will be aware of a technique referred to as Maximum Power Point Tracking or MPPT. This technique constantly makes slight adjustments to the current drawn from the solar panel, monitoring the voltage produced, and keeps the operating point correct to maximize the energy supply rate (the flow rate of energy produced). For a power input of a type configured to connect to an environmental power source, such as power input 610, AMSED 605 can implement MPPT for the electrical energy it receives. MPPT can be implemented in the circuitry of power input 610 and the input power converter to which the power input attaches. (The input power converter is not shown in this diagram. Its functions are discussed earlier in the section regarding FIG. 2 where the input power converter is identified by reference number 230). MPPT can also be implemented in a combination of software executing on processor 225 as well as in the circuitry of power input 610 and its associated input power converter.

The AMESD can have one or more additional power inputs, such as power input 627. In this embodiment, power input 627 is configured to receive 120 volts ac, but can be configured differently in other embodiments. Power input 627 can be connected to an electrical outlet power source and electrical energy can be transferred into the AMESD through power input 627. This can occur at the same time electrical energy is transferring into the AMESD from solar panel 615 through power input 610. However, in the embodiment depicted, power input 627 is not connected, no electrical energy can transfer through it, and no other power source is shown.

AMESD 605 can also have one or more power outputs. In the embodiment depicted in FIG. 6, there are three power outputs 630, 633, and 635, but only power output 630 is shown connected. Power output 630 can be a conventional electrical outlet that supplies the 120 volts ac produced by an inverter. The types of power outputs 633 and 635 are not specified. Power output 630 can be connected and transfer electrical energy to a powered device 640, which can be a device compatible with power output 630 (plugs into a 120V ac outlet). In some instances, multiple power outputs can be connected to powered devices with combinations of power outputs enabled and transferring electrical energy. In still other instances, there can be no power outputs that are enabled or connected: resulting in no electrical energy transferring out of the AMESD. In this last example, the incoming solar derived electrical energy will be used only to charge the AMESD. (The term charge is used to describe electrical energy transferring into an AMESD for storage in the energy storage component 205 (FIG. 2) of the AMESD).

Environmental factors can control both the amount of and the rate at which incoming energy from an environmental energy source is received by an environmental power source. Referring again to FIG. 6, an environmental factor 645 can be the position in the sky of sun 620. The sun's position can affect the angle at which the solar radiation strikes solar panel 615, which in turn can control the amount of and rate at which solar energy is collected. Environmental power sources, such as the solar panel, supply electrical energy converted from the energy received, making the rate at which that electrical energy is supplied responsive to the environmental factor. Focusing on solar panel 615, energy supply rate 623 from the solar panel is responsive to environmental factor 645, the sun's position. This response can be modelled using the sine of the elevation angle of the sun. (The elevation angle is approximately 0° when the sun is on the eastern horizon, 90° when the sun is at its zenith, and 180° when the sun is on the western horizon). The resulting response function is then:

$$f = \sin(\text{elevation}) \qquad [\text{EQN 3}]$$

$$P_{supply} = P_{nom} \cdot f = P_{nom} \cdot \sin(\text{elevation}) \qquad [\text{EQN 4}]$$

where:
f=Environmental Factor
$P_{supply}$=Energy Supply Rate from Environmental Power Source
$P_{nom}$=Nominal Energy Supply Rate (when sun at its zenith)

Environmental factor 645 (the sun's position) can be predicted in advance for a given time of day. A variable h can be assigned to represent a given time of day in decimal hours. Using this representation, 7:30 am will correspond to h=7.5 and 3:15 pm will correspond to 15.25. A variable $h_{sunrise}$ can be assigned a value corresponding to the hour of sunrise, at which time the elevation angle of sun 620 is 0°. Likewise, a variable $h_{sunset}$ can be assigned a value corresponding to the hour of sunset, at which time the elevation angle of the sun is 180°. The time of the sun's zenith can be approximated as half way between $h_{sunrise}$ and $h_{sunset}$. This results in the following equation for predicting the elevation of the sun at a specified time of day. (The time of day is measured in decimal hours and is represented by the variable h):

$$\text{sunhours} = h_{sunset} - h_{sunrise} \qquad [\text{EQN 5}]$$

$$\text{elevation}_{predicted}(h) = \frac{h - h_{sunrise}}{\text{sunhours}} \cdot 180° \qquad [\text{EQN 6}]$$

The result of EQN 5 and EQN 6 for the predicted elevation can be substituted into EQN 3 and a predicted value for the environmental factor f at time h can be obtained. This value, in turn, can be substituted into the first half of EQN 4 to obtain the predicted value for $P_{supply}$ at time h, where $P_{supply}$ represents energy supply rate 623, the rate which electrical energy will be supplied from the solar panel to AMESD 605:

$$f(h) = \sin\left(\frac{h - h_{sunrise}}{h_{sunset} - h_{sunrise}} \cdot 180°\right) \qquad [\text{EQN 7}]$$
$$P_{supply}(h) = P_{nom} \cdot f(h)$$

-continued $$P_{supply}(h) = P_{nom} \cdot \sin\left(\frac{h - h_{sunrise}}{h_{sunset} - h_{sunrise}} \cdot 180°\right) \quad [\text{EQN 8}]$$

Processor 225 of AMESD 605 can utilize a look-up table or other suitable mapping technique to determine $h_{sunrise}$ and $h_{sunset}$ from the day of the year. The lookup table can be stored within the AMESD. The table can be loaded into the AMESD from another source, such as from a device connected via wireless network 255 or from the internet. With the accompanying loss of efficiency and energy harvested, the model can be simplified by assuming that sunrise and sunset times are always at 6:00 am and 6:00 pm. The constant $P_{nom}$ of EQN 6, the nominal value for $P_{supply}$ (the energy supply rate 623), represents the value of $P_{supply}$ before it is reduced by environmental factor f (the sun's position 645), which is the value of $P_{supply}$ when the sun is at its zenith. In most instances, this will not be known ahead of time, i.e., the AMESD will be operating at a time before or after noon and there will have been no opportunity to measure $P_{supply}$ at the sun's zenith. However, $P_{nom}$ can be deduced. It can be estimated by using $P_{curr}$, the measured value for energy supply rate 623 at $h_{curr}$ (the current time in decimal hours). These quantities can be used with EQN 4 and EQN 6 to back-solve for what $P_{nom}$ should be, given that $P_{curr}$ was measured:

$$\text{elevation}_{curr}(h_{curr}) = \frac{h_{curr} - h_{sunrise}}{\text{sunhours}} \cdot 180° \quad [\text{EQN 9}]$$

$$P_{curr} = P_{nom} \cdot f(h_{curr}) = P_{nom} \cdot \sin(\text{elevation}_{curr}) \quad [\text{EQN 10}]$$

$$P_{nom} = \frac{P_{curr}}{\sin(\text{elevation}_{curr})} \quad [\text{EQN 11}]$$

The estimate of $P_{nom}$ can be improved as time elapses. The value of $P_{curr}$ can be measured at multiple points in time corresponding to multiple values of elevation. A regression technique can be used to find the best value for $P_{nom}$ to fit EQN 10 to the measurements. AMESD 605 can use a RTC, or Real Time Clock, (not shown) to keep track of the current time. The RTC can also be used to keep track of the current day of the year (which can then be used to lookup $h_{sunrise}$ and $h_{sunset}$). In the earlier discussion regarding FIGS. 2 and 3, estimate of time 365 until state of charge 215 reaches a particular level was discussed. (The state of charge is a characteristic of energy storage component 205 of AMESD 200). The possible usefulness of these estimates to a user of the AMESD was discussed, particularly regarding the estimates of time $t_{full}$ and $t_{empty}$. In that embodiment, the estimate of time was based on the assumption that energy storage rate 217 will continue at its present value. From the discussion regarding FIG. 2: the energy storage rate is the sum of the positive energy flow rates from the energized input power converters 230 and the negative energy flow rates into the energized output power converters 224 and 224', neglecting any losses. In mobile energy storage system 600, the electrical energy flow rate from the environmental power source, energy supply rate 623, can comprise one of these positive energy flow rates and thus affects the value of energy storage rate 217 (FIG. 2). Estimate of time 365 (FIG. 3) can be improved from the previous assumption of an unchanging energy storage rate 217 by using predicted future values for the energy storage rate. In the embodiment being discussed, energy storage rate 217 can be predicted by using predicted future values of energy supply rate 623. The energy storage rate now becomes a changing function of time rather than a constant. Estimating a future value for state of charge 215 (FIG. 2) at a time in the future $t_f$ can be determined by integration of the predicted energy supply rate:

$$SOC(t_f) = SOC_0 + \frac{1}{C}\int_{t_0}^{t_f} r_{storage}(t)dt \quad [\text{EQN 12}]$$

where:
$SOC_0$=initial value for State of Charge at time $t_0$
$SOC(t_f)$=predicted State of Charge at time $t_f$
C=Capacity of Energy Storage Component
$t_f$=time in the future of prediction
$t_0$=current time
$r_{storage}(t)$=predicted Energy Storage Rate at time t
t=time (over which to integrate from $t_0$ from $t_f$)

Processor 225 can determine estimate of time 365 (FIG. 3) until state of charge 215 (FIG. 2) reaches a particular level by evaluating EQN 12 above. This can be done with well-known techniques of numerical integration. At each iterative time step, the estimated future value for the state of charge can be determined and then compared to the particular level. When the state of charge reaches the particular level, the current value of the integrating time variable can be used for the estimate of time.

Returning again to FIG. 6, the block diagram depicts an additional environmental factor 650 affecting energy supply rate 623 from solar panel 615. Environmental factor 650 can be a component of the weather, such as cloud cover, that can affect the amount of solar radiation from sun 620 that is received by the solar panel 615. This is similar to the circumstances that were discussed earlier regarding environmental factor 645 (position of the sun in the sky); by controlling the amount of solar energy available to the solar panel, the energy supply rate is responsive to environmental factor 650 (cloud cover). In an embodiment, the response function for environmental factor 650 can be modelled as linear, that is:

$$f = P_{nom}(1-CC) \quad [\text{EQN 13}]$$

$$P_{supply} = P_{nom} \cdot f = P_{nom} \cdot (1-CC) \quad [\text{EQN 14}]$$

where:
f=Environmental Factor
$P_{nom}$=Nominal Energy Supply Rate
CC=Cloud Cover (0=clear sky, 1=completely cloudy)
$P_{supply}$=Energy Supply Rate from Environmental Power Source In other embodiments, any suitable type of modelling, either currently available or yet to be developed, can be used.

Estimate of time 365 (FIG. 3) can be affected by environmental factor 650, the cloud cover CC, in the same way it is affected by environmental factor 645, the sun's position. Energy supply rate 623, $P_{supply}$ in EQN 14 above, is determined by the cloud cover. Following the reasoning outlined above, the energy supply rate contributes to the determination of energy storage rate 217 (FIG. 2). EQU 12 can then be used to estimate a future value for state of charge 215 (FIG. 2) by integrating the energy supply rate, the function $r_{storage}(t)$ in the equation. Processor 225 can perform numerical integration and the state of charge evaluated at each time step. The estimate of time is determined when the state of charge reaches the particular level.

A practitioner of ordinary skill in the art will recognize that the accuracy of determining estimate of time 365 (FIG. 3) in the above discussion can be improved by the use of more complicated models. For example, in EQN 3 of the present embodiment, the response function to environmental factor 645, the sun's position, is based on the model that solar energy collected is in proportion to the cosine of the angle of incidence at which the solar radiation strikes solar panel 615. (The angle of incidence is modelled as the complement of the elevation angle. Taking the cosine of the elevation subtracted from 90° results in the sine function observed in EQN 3). For some solar panel technologies, a different model can provide more accurate results for the response of the electrical energy produced to the angle of incidence of the incoming solar energy. A different embodiment can incorporate such models, which can use higher order equations and more complicated algorithms. As another example, the model used to predict the relative position of the sun that resulted in EQN 6 can also be still further improved. An improved model is discussed later regarding FIG. 8, which can be incorporated into a different embodiment.

Figure 7:
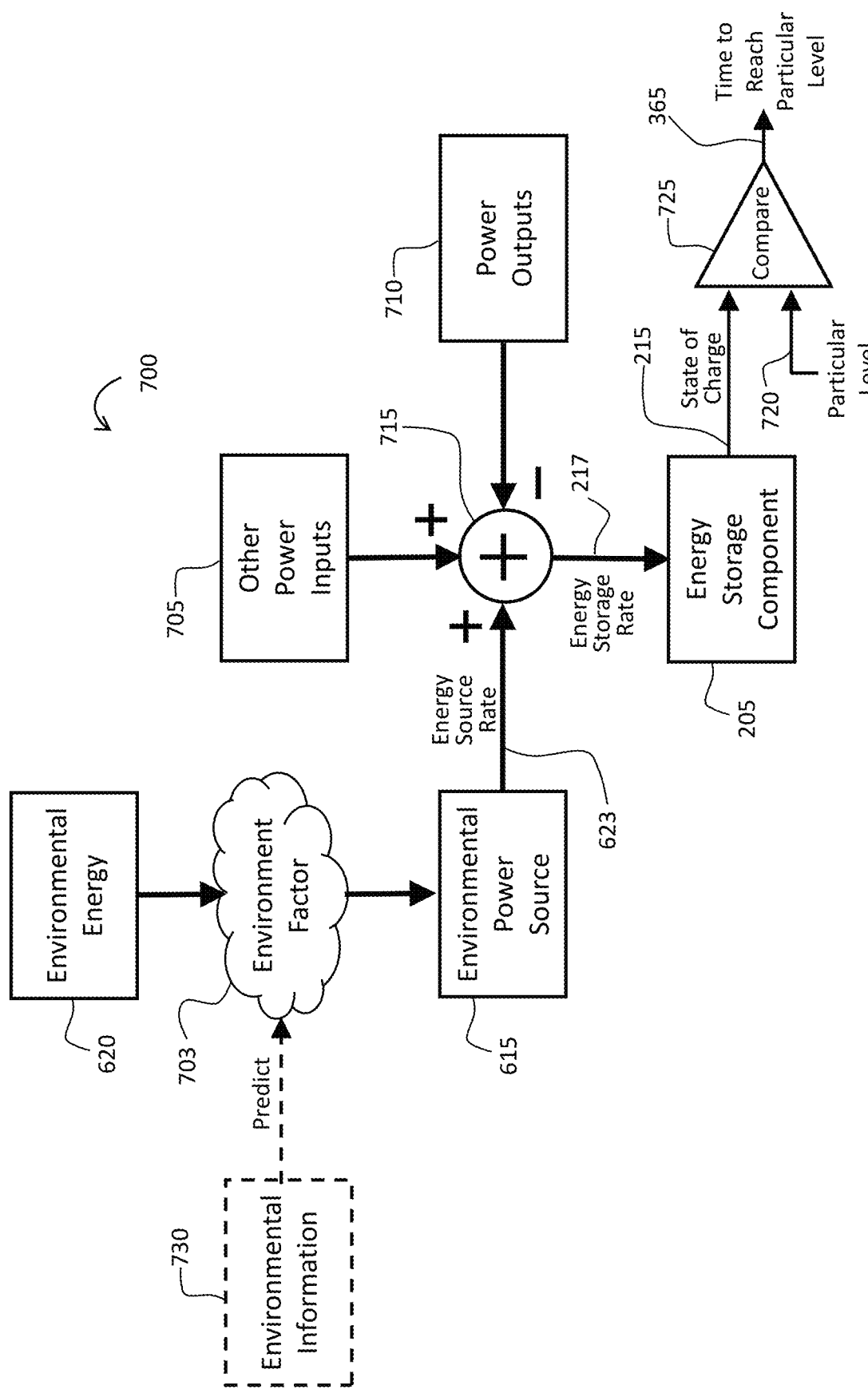
FIG. 7 is a diagrammatic illustration of the determination of an estimate of time until the state of charge of an AMESD reaches a particular level in accordance with the present disclosure.

FIG. 7 is a diagram, generally indicated by reference number 700, that illustrates how the various quantities and values of the previous discussion interact and function together to determine estimate of time 365. Environmental power source 615 receives energy from environmental energy source 620. In the embodiment discussed above, the environmental energy source is the sun providing solar energy. As previously discussed, there can be other environmental energy sources 620 such as wind, hydro, and thermal. The energy from the environmental energy source can be controlled by an environmental factor 703, such as the sun's position 645 (FIG. 6) and cloud cover 650 (FIG. 6). In some embodiments, there can be multiple environmental factors 703 operating at the same time on the same environmental energy source 620. There can also be multiple environmental energy sources 620 being harvested at the same time. Environmental energy can be converted into electrical energy by environmental power source 615. The electrical energy is supplied at energy source rate 623 into AMESD 605. (The AMESD is not shown in this diagram and was discussed earlier regarding FIG. 6). Inside the AMESD, the electrical energy is processed by input energy converter 230 (FIG. 2) to a voltage compatible with energy storage component 205. Electrical energy can also enter the AMESD through a sum of other power inputs 705, such as power input 627 (FIG. 6). Electrical energy can leave the AMESD through a sum of power outputs 710, such as power output 630, 633, and 635 (FIG. 6). Energy source rate 623, the energy flow rate from the sum of other power inputs 705, and the energy flow rate into the sum of other power outputs 710 (negative because the energy is leaving) are combined 715 to determine energy storage rate 217, the flow rate of energy into energy storage component 205. The integration over time of the energy storage rate determines state of charge 215 for the energy storage component per EQN 12. Estimate of time 365 is determined by the prediction of when the state of charge reaches a particular level 720. Processor 225 can determine the estimate of time by numerically integrating the energy storage rate $r_{storage}(t)$ in EQN 12 and comparing 725 the state of charge to the particular level at each iterative time step.

Environmental factors 703 can be a result of a stochastic process. That is, the value of an environmental factor at some future time can be probabilistic and can have a statistical distribution. The statistical distribution can be characterized by an expected value and a standard deviation. In some embodiments, statistical techniques that account for and use entire statistical distributions can be used to calculate the estimate of time 365 until particular level 720 is reached by state of charge 215. In the present embodiment, independent Gaussian statistical distributions are assumed and the expected value of the distribution can be used as an estimate.

Information used to predict the values of environmental factors 703 at a future time can be referred to as environmental information 730. The latter can contain information about the statistical distribution of future values for the environmental factors for a range of future times. For example, in FIG. 6, weather forecast environmental information 655 can list, for each hour interval over the next 24 hours, the expected value of cloud cover environmental factor 650. Different embodiments can communicate the environmental information in other formats. For example, the interval size and number of intervals can be different. In other embodiments, a piece-wise-linear or analytic function for the expected future value of a cloud cover environmental factor can be used.

A practitioner of the art will quickly realize that the preceding discussion regarding environmental factor 650 applies to environmental energy sources 620 other than solar. For example, in an embodiment harnessing wind power, where environment energy source 620 is the wind and environmental power source 615 is a wind turbine powered electric generator, the amount of energy available can be dependent on the wind speed, which can function as environmental factor 703. The wind speed can be predicted and environmental information 730, such as a weather prediction, can be used to provide statistical distribution of future values for the environmental factor (the wind speed).

As previously discussed, the power produced by solar panels is a strong function of the sun's relative position. In this same way, the orientation of the panels can strongly affect the amount of power produced, making correct orientation of the panels important. Applicants note that in mobile applications, where the panels can be repeatedly set up and taken down, properly adjusting the orientation of the panels can become a burden to the user. Accordingly, the AMESD of the present disclosure can assist the user in properly orienting a solar panel.

Figure 8:
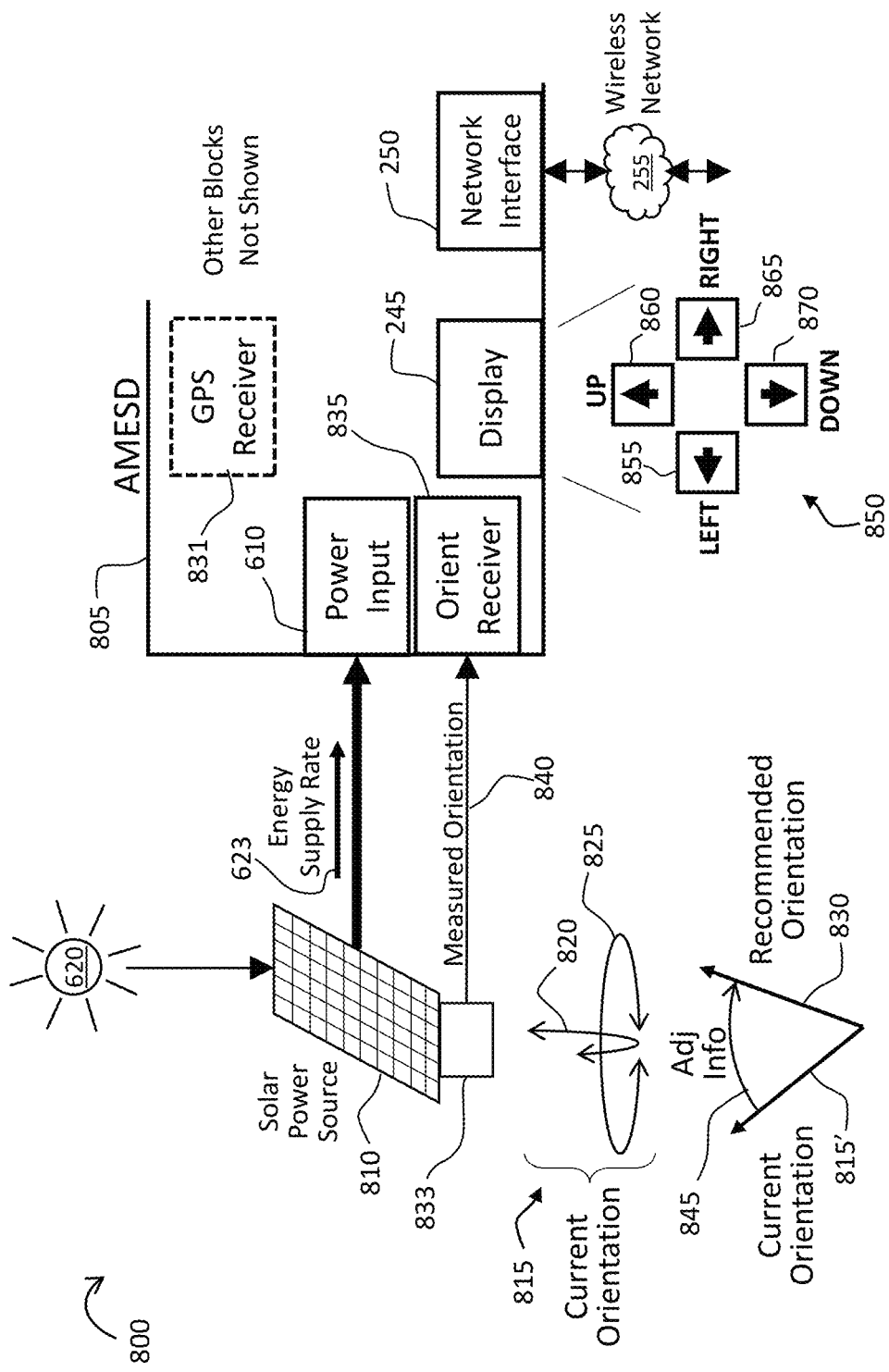
FIG. 8 is a block diagram of a mobile energy storage system with additional details at least showing the adjustment of the orientation of a solar power source used to supply electrical energy to an AMESD in accordance with the present disclosure.

The reader's attention is now directed to FIG. 8, which is a block diagram of a mobile energy storage system, generally indicated by reference number 800, that includes another embodiment of an AMESD 805, in accordance with the present disclosure, configured to assist a user with properly aligning a solar power source 810. In the diagram, AMESD 805 can include the structure of previously described AMESD 200 of FIG. 2. Accordingly, the present descriptions will be limited to describing differences and the figure is likewise limited to illustrating those differences with components that are not explicitly shown in FIG. 8 being understood to be present for purposes of brevity. Some of the additional blocks that are not shown and can comprise the AMESD are power inputs 227, power outputs 220 and 220', energy storage component 205, and processor 225. (These additional blocks are discussed in the section regarding FIG. 2). AMESD 805 can receive electrical energy from solar power source 810 through power input 610. The flow of electrical energy from the solar power source to the AMESD can be characterized by an energy supply rate 623.

In the present embodiment, solar power source 810 can be environmental power source 615 configured to receive solar energy from sun 620 as discussed previously regarding FIG.

6. A practitioner of the art will realize that there are many ways in which mobile energy storage system 800 can comprise solar power source 810. In one example embodiment, the solar power source can be a separate device attached to the AMESD by an electric cable. In another example embodiment, the solar power source can be an integral component of AMESD 805, such as integrated into the top of the AMESD.

Solar power source 810 can be characterized by a current orientation 815, the direction pointed by the light-entering axis of the solar power source. When the solar power source comprises a planar solar panel, the light-entering axis is parallel to the normal to the plane of the solar panel. The current orientation (like the recommended orientation) can be represented in different ways. One way is to use measures on axes that conveniently represent the way in which the current orientation of the solar power source changes. These axes can, but do not necessarily, correspond to the actual way in which the solar power source mechanisms allow the current orientation to be adjusted. In embodiment 800, the solar power source is configured such that the current orientation is a direction in three dimensions represented by an elevation 820 and an azimuth 825. An angle of elevation measurement was discussed earlier regarding the sky position of the sun in the discussion about FIG. 2. Elevation 820 is the angle formed between the current orientation and its projection into the horizontal plane of the surface. The angle can vary from 0° when the solar power source points toward one horizon, through 90° when it points straight up perpendicular to the surface, to 180° when it points toward the opposite horizon. Azimuth 825 is the angle of rotation, about an axis perpendicular to the surface, of the projection of the current orientation into that surface. In other words, the azimuth can be thought of as the angle of rotation of the solar panel about an axis perpendicular to the surface. The angle can vary from 0° when the solar power source points north, through 180° when it points south, to a limit of 360° when it approaches north again. The current orientation can also be thought of a vector, the depiction of which is identified in the diagram by the reference number 815'.

A practitioner knowledgeable in the art of solar energy will be aware that the amount of solar energy collectable from a solar panel can generally be maximized by orienting the panel so that it faces south at an elevation angle equal to the latitude subtracted from 90°. So, for a similarly optimized panel being installed in Boulder, Colo. (40° N, 105° W), it would be installed facing south with an elevation of 90°−40°=50°. This direction forms a recommended orientation 830. As depicted in FIG. 8, the current orientation of solar power source 810 significantly differs from the recommended orientation. Consider a given period of time, such as the coming year. With the panel of the solar power supply at current orientation 815, the sun 620 will sweep through the range of its predicted positions and a determination can be made as to the expected amount of energy that will be collected and converted to electricity. When the solar power source is adjusted to a second orientation, the same determination can be made. By using recommended orientation 830 as the second orientation, with other environmental factors being the same, a second amount of energy collected at the second orientation will be larger than the amount of energy that would otherwise be collected at the first orientation. Orientation 830 is recommended because it is known in the art of solar energy that for a fixed solar panel so oriented, considering only the sun's position environmental factor 645 (FIG. 6), the average amount of energy collected will be maximized. Applicants note that this does not necessarily mean that if other environmental factors are considered, such as cloud cover 650 (FIG. 6), the same recommended orientation 830 will result. This will be discussed in greater detail below.

AMESD 805 can assist the user of the device in properly orienting solar power source 810. As discussed in the preceding paragraph, the recommended value for elevation 820 can be determined from the latitude for the present location of the solar power source. In embodiments with a global positioning system (GPS) receiver, processor 225 (FIG. 2) can use the GPS receiver to determine the latitude directly. The AMESD can incorporate an embedded GPS receiver 831 or, in other embodiments, a receiver can be located in a device connected to the AMESD through network adapter 250 and wireless network 255. One example of such a device can be an external computing device 535 (FIGS. 5A-5C). The recommended value for elevation 820 of the solar power source can be communicated to the user, such as through display 245. The other part of recommended orientation 830, azimuth 825, can also be communicated to the user in the same way. (In the present example, the recommended azimuth is south). The recommended orientation can also be determined without the use of a GPS receiver. In other embodiments, the location of the AMESD can be supplied by the user. A map can be presented to the user, such as on display 245, and the user allowed to identify the location on the map, such as by use of controls 240 (FIG. 2). In other embodiments, the controls can be combined with the display to allow identification by touchscreen. In yet other embodiments, the user can indicate the name of a nearby major city, such as by pick-list or typing. A lookup table can then be used to map the city name to a latitude. The display and location selection can be on the AMESD, on the external computing device, or on some combination of both. In still other embodiments, the name of the major city can be spoken by the user and the city identified by a commonly available speech recognition algorithm, such as by a speaker independent pretrained neural net. Performance of these algorithms, determinations, and location of map storage can be located on the AMESD, the external computing device, on the internet, or by some combination of the three. The functionality allocated to the external computing device can at least be partially located within app 540 (FIG. 5).

Recommended orientation 830 for solar power source 810 is currently chosen to maximize the amount of solar energy collected by solar power source 810 for a period of an entire year. For shorter periods of time, that recommendation can be improved. For example, if mobile energy storage system 800 is set up in the afternoon and will only operate until evening, it will miss collecting the morning's solar energy. In this scenario, a recommended orientation that favors the afternoon hours will gather more energy than an orientation optimized falsely assuming both morning and afternoon operation. An improved recommended orientation can be determined by predicting the amount of solar energy collectable over the range of predicted sun's position for the given time period that system 800 will be operated.

Equations and algorithms, of varying degrees of complexity and accuracy, and that will predict the relative position in the sky of the sun at a given time and location (latitude and longitude), are well known within the art of solar energy. Processor 225 of AMESD 805 can use one such equation or algorithm to predict the amount of solar energy collectable over the range of predicted sun's position for the given time period that system 800 will be operated. A candidate orientation for the solar power source can be chosen. (This will be discussed in more detail shortly). The rate at which solar energy will be collected at a given time can be modelled as proportional to the cosine of the angle between candidate orientation and the position of the sun at that time. (As discussed earlier regarding FIG. 6, more complex models than cosine can also be used). This rate can be integrated over the given time period using the predicted sun position to determine the amount of solar energy collected for that candidate orientation. The candidate orientation that collects the maximum amount, the recommended orientation, can be found in a variety of ways. One way, for example, can be to use a gradient ascent method. Other environmental factors 703 (FIG. 7) can be included to further improve the recommended orientation. This can be accomplished by amending the rate of solar energy collection in the integration to include the effect of the other factors. Environmental information 730 (FIG. 7) can be used in the determination of environmental factor values as time changes through the integration of the solar energy rate.

Orienting solar power source 810 to recommended orientation 830 can be difficult for a user of mobile energy storage system 800. For example, when aligning the solar power source to a recommendation for elevation 820, the user may require a plumb bob and protractor. Some users may find it possible to set the elevation accurately enough by eye, without additional equipment. However, it can be very difficult for the user to align the solar power source to a recommendation for azimuth 825 without a compass. As will be described immediately hereinafter, Applicants have resolved this concern in what is believed to be a heretofore unseen manner.

Solar power source 810 can be attached to an orientation sensor 833, which can be used to assist the user of mobile energy storage system 800 to orient the solar power source to recommended orientation 830. The orientation sensor can measure some or all components of current orientation 815. For example, the orientation sensor can measure elevation 820 using a commercially available part, such as a tilt sensor or accelerometer. Azimuth 825 can also be measured using, for example, an electronic compass module. The measurements can be communicated to an orientation receiver 835 over a communication link 840. The communication link can communicate serial data over a separate set of wires connecting the solar power source to AMESD 805. In another embodiment, the communication link can 'piggyback' on the wires conducting the electrical energy from the solar power source to the AMESD, eliminating the need for an additional cable. Serial data communicating the measured orientation can be superimposed onto the electrical energy dc voltage using one of many communication protocols that are well-known within the art, such as a FM modulated AC-coupled carrier. In another embodiment, the communication link can be a modulated radio link. In yet another embodiment, the orientation sensor can interface to wireless network 255 and communication link 840 can be through the wireless network. Processor 225 can obtain a measurement of current orientation 815 from orientation receiver 835.

Adjustment information 845 can be determined by processor 225 from the measurement of current orientation 815 and recommended orientation 830. The adjustment information can be communicated to the user via display 245. In an embodiment in which external computing device 535 (FIGS. 5A-5C) is connected through wireless network 255, the display on the external computing device can be used, or both simultaneously. The adjustment information can be a numerical or graphical representation, and can also be a combination of both. In one example embodiment, the component values of the recommended orientation and the current orientation can be displayed numerically, which can allow the user to adjust the orientation of solar power source 810 until the current orientation is acceptably close to the recommended orientation. In another example embodiment, a graphic of a meter face can be displayed. A graphic depiction of two needles can be superimposed upon the meter face: one indicating the current orientation and the other indicating the recommended orientation. Processor 225 can also compare the measurement of current orientation 815 to the recommended orientation 830 and determine adjustment information 845 that is relative to the current orientation. This advantageously reduces or eliminates the need for the user to make comparisons while adjusting the orientation. Relative adjustment information 845 can be determined by calculating the vector (component based) difference between the recommended orientation and the current orientation. Adjustment information 845 that is relative can be displayed in a manner similar to one of those described above.

Adjustment information 845 can also be displayed in a manner such that the user can easily discern the next adjustment to make in aligning the orientation of the solar power source 810. For example, a group of indicators 850 (located in FIG. 8 near display 245) can readily communicate the next adjustment to make. In the embodiment depicted, four square-shaped indicators comprise the group 850, each representing a direction that can be adjusted. The indicators are individually identified by reference number 855, 860, 865, and 870 and each identified by the text "LEFT", "UP", "RIGHT", "DOWN" respectively. Each indicator is labeled in its center with an arrow pointing in a direction corresponding to the text label. In other embodiments, the number of indicators comprising the group and their arrangement can be different, as can their attributes such as shape, directions, labels, markings, and so on. The directions indicated need not be orthogonal nor Euclidian: a rotation can be indicated. When indicating an adjustment to the user, an indicator can light up, un-blank, change color, change shape, animate, and so on. In addition, group 850 can be altered to aid in the indication, including, without limitation, rearranging, animating the arrangement of, and changing the number of the indicators displayed. In the embodiment depicted, group of indicators 850 is shown as an image on display 245. In other embodiments, a display on a device connected via wireless network 255, such as external computing device 535 (FIGS. 5A-5C), can be used. In some embodiments, the indicators can be illuminated, such as by LEDs. These can be positioned on the exterior of AMESD 805 or solar power source 810 so that the indicators are easily visible by the user. In some embodiments, the illuminated indicators can be located on or near the places of adjustment on the solar power source.

The foregoing description of the invention has been presented for purposes of illustration and description. Accordingly, the present application is not intended to be exhaustive or to limit the invention to the precise form or forms disclosed, and other embodiments, modifications and variations may be possible in light of the above teachings wherein those of skill in the art will recognize certain modifications, permutations, additions and sub-combinations thereof.

What is claimed is:

1. An advanced mobile energy storage device, comprising:

an energy storage component for the storage of electrical energy;

at least one power output through which electrical energy is transferable out of said storage device from at least the energy storage component;

at least one power input through which electrical energy is transferable into said storage device at least for storage within the energy storage component; and a processor configured to determine adjustment information for use by a user of said storage device to adjust a current directional orientation of a light entering axis of a solar power source to a recommended directional orientation such that a predicted amount of solar energy provided to the power input and collectable over a given time period subsequent to the adjustment is greater than another predicted amount of solar energy that would otherwise be collected at the current directional orientation for the given time period.

2. The advanced mobile energy storage device of claim 1 wherein changing the current directional orientation to the recommended directional orientation at least approximately maximizes the predicted solar energy collectable for the given time period.

3. The advanced mobile energy storage device of claim 1 wherein the solar power source is an integral component of said advanced mobile energy storage device.

4. The advanced mobile energy storage device of claim 1 wherein at least one power input thereof is configured to connect to receive electrical energy from the solar power source.

5. The advanced mobile energy storage device of claim 1 wherein the adjustment information includes an adjustment direction that is referenced relative to the current directional orientation.

6. The advanced mobile energy storage device of claim 5 wherein the adjustment direction includes one from a set of 4 perpendicular directions.

7. The advanced mobile energy storage device of claim 1 wherein the solar power source includes an orientation sensor for at least aiding in the determination of the current directional orientation.

8. The advanced mobile energy storage device of claim 1 wherein an instantaneous rate at which electrical energy is transferred from the solar power source is used as at least part of the determination of the adjustment information.

9. The advanced mobile energy storage device of claim 1 wherein a geographic location of said device is used as at least part of the determination of the adjustment information.

10. The advanced mobile energy storage device of claim 9 wherein a global positioning system output determines the geographic location.

11. The advanced mobile energy storage device of claim 1 further comprising:

a network interface for communication over a wireless network, wherein data communicated over the wireless network is used as at least as part of the determination of the adjustment information.

12. The advanced mobile energy storage device of claim 11 wherein the communication over the wireless network includes communication over the Internet.

13. The advanced mobile energy storage device of claim 11 wherein an external computing device is in communication with the advanced mobile energy storage device via the wireless network and the processor cooperates with the external computing device to determine the adjustment information.

14. The advanced mobile energy storage device of claim 13 wherein the external computing device includes a global positioning system that generates a position for use as at least part of the determination.

* * * * *